United States Patent [19]

Arimoto

[11] Patent Number: 5,226,009
[45] Date of Patent: Jul. 6, 1993

[54] SEMICONDUCTOR MEMORY DEVICE SUPPORTING CACHE AND METHOD OF DRIVING THE SAME

[75] Inventor: Kazutami Arimoto, Hyogo, Japan

[73] Assignee: Mitsubishi Denki Kabushiki Kaisha, Tokyo, Japan

[21] Appl. No.: 651,848

[22] Filed: Feb. 7, 1991

[30] Foreign Application Priority Data

Mar. 30, 1990 [JP] Japan .................................. 2-87050

[51] Int. Cl.⁵ ............................................ G11C 13/00
[52] U.S. Cl. ................................. 365/189.04; 365/200; 365/49
[58] Field of Search .............. 365/189.01, 200, 189.07, 365/49, 189.04, 230.01, 230.02, 230.03, 230.08

[56] References Cited

U.S. PATENT DOCUMENTS

| 4,740,971 | 4/1988 | Tam et al. ........................... 365/200 |
| 4,860,262 | 8/1989 | Chiu .................................. 365/189.01 |
| 5,043,943 | 8/1991 | Crisp et al. ......................... 365/200 |

FOREIGN PATENT DOCUMENTS

3834759A1  6/1989  Fed. Rep. of Germany.

*Primary Examiner*—Terrell W. Fears
*Attorney, Agent, or Firm*—Lowe, Price, LeBlanc & Becker

[57] ABSTRACT

A semiconductor memory device includes a dynamic random access memory (DRAM) cell array (300) as a main memory, a static random access memory (SRAM) cell array (310) as a cache memory, and a content addressable memory (CAM) cell array (320) as a tag memory. The SRAM cell array has word lines (SWL) corresponding in number to match detection lines (23-1 to 23-4) of the CAM cell array. The CAM cell array retrieves contents thereof using external row address as retrieval data. When a match is found in the CAM cell array, a match detection signal is supplied to a match detection line for directly driving a corresponding word line in the SRAM cell array. This semiconductor memory device includes circuitry (22, 22') for generating a cache hit/miss indicating signal in response to signal potentials of the word lines of the SRAM cell array. When the cache hit indicating signal is generated, a column address signal selects a column in the SRAM cell array, and access is made to a memory cell at a crossing between the driven row and selected column of the SRAM cell array. When the cache miss indicating signal is generated, access is made to a memory cell selected by the row address and column address in the DRAM cell array through a column in the SRAM cell array, and in addition data is transferred to a block in the SRAM cell array selected by a block selecting signal from a corresponding block in the DRAM cell array. Further, on a cache miss, data transfer is made prior to external access from a block in the SRAM cell array to a corresponding block in the DRAM cell array.

15 Claims, 9 Drawing Sheets

SEMICONDUCTOR MEMORY DEVICE SUPPORTING CACHE AND METHOD OF DRIVING THE SAME

BACKGROUND OF THE INVENTION

1. Field of the Invention

The present invention relates to a semiconductor memory device, particularly to a semiconductor memory device having a dynamic random access memory (DRAM) and a static random access memory (SRAM) formed on the same semiconductor chip, and to a method of driving the semiconductor memory device. More particularly, the invention relates to a semiconductor memory device containing cache with a main memory and a cache memory formed on the same semiconductor chip, and to a method of driving the semiconductor memory device.

2. Description of the Background Art

With progress of semiconductor technology, a central processing unit (CPU) has become operable at high speed and so has a DRAM. However, a DRAM cannot follow the development in the speed of CPU and the difference in operating speed therebetween has increased. This is bottle-neck in improvement of data processing speed of computer systems.

In a large-scale system such as a mainframe, a high-speed cache memory is interposed between a main memory and a CPU to compensate for the operating speed of the main memory, thereby to improve performance without a significant increase in cost.

For a small-scale system, a construction has been proposed and put to practical use, in which a cache memory is formed on the same semiconductor chip as that on which a DRAM is formed, to realize equivalently a high-speed operation of the main memory. In such DRAM containing cache, data transfer between an SRAM acting as cache memory and a DRAM acting as main memory is effected at high speed by using an internal data bus having a large bit width.

FIG. 1 shows a conceptional construction of a system employing a conventional DRAM containing cache.

Referring to FIG. 1, the processing system comprises a microprocessor 100 for carrying out various processes according to predetermined programs, a cache controller 110 for controlling operation of the cache memory, a tag 120 operable in response to an address from outside of the cache for determining a cache hit/miss and designating a corresponding "way", a DRAM controller 130 for controlling operation of a DRAM section, and a DRAM 200 containing cache memory (cache DRAM).

The cache DRAM 200 includes a DRAM section 210 having, for example, a 1M bit storage capacity, and an SRAM section 220 having, for example, an 8K bit storage capacity. The DRAM section 210 includes 4 plates of 256K bit DRAM, each DRAM plate being divided into 64 groups each having an 8-bit width. The SRAM section 220 includes 2 plates of 2K bit SRAM, each SRAM plate being divided into 64 blocks each having a 32-bit (8×4) size. Each block of the SRAM is further divided into four 8-bit ways. This construction provides a four-way set associative system. The input/output data width is 4 bits (DQ1-DQ4).

Data transfer between DRAM section 210 and SRAM section 220 is performed in a block through an internal data bus 230 having a 32-bit width.

The microprocessor 100 transfers 4-bit data DQ1-DQ4, outputs 18-bit addresses A0-A17, and transmits necessary control signals to the DRAM controller 130 and cache controller 110.

Though not expressly shown, the tag 120 includes a tag memory for storing addresses (tag address A0-A8 and set address A9-A14) for data stored in the SRAM section 220, a comparator for comparing the tag addresses stored in the tag memory and an address received from the microprocessor 100, and a tag replacement logic processor for generating a way address designating a region of the SRAM section 220 for which data rewriting is to be carried out in accordance with a result of comparison in the comparator.

The cache controller 110 is operable in response to a cache hit/miss indicating signal from the tag 120 for generating a signal $\overline{BT}$ instructing data transfer between SRAM section 220 and DRAM section 210.

The DRAM controller 130 generates a row address strobe signal $\overline{RAS}$ and a column address strobe signal $\overline{CAS}$ for operating the DRAM section 210 on a cache miss. A data reading operation of this cache DRAM will be described briefly in the following.

The SRAM section 220 has a four-way, 64-set construction. One set corresponds to one block in the DRAM section 210. Access is made to this cache DRAM according to the 18-bit address signals A0-A17. Fifteen bits in the 18-bit address A0-A17 are applied also to the tag 120. The tag address and set address (address A0-A14) applied to the tag 120 are compared with the addresses stored therein, and cache hit/miss is determined on the result of the comparison.

In parallel with the cache hit/miss determination at the tag 120, access is made to the SRAM section 220 in the cache DRAM 200. The address signals A9-A14 designate one of the 64 sets in the SRAM section 220, and the address signals A15-A17 designate which of the eight columns (One set has 8 bits.) in the designated set is addressed. The 16 bits present on the designated column (4 bits per way) are transmitted to a stage just front of an output.

When an address of data stored in the SRAM section (cache memory) 220 coincides with an address stored in the tag 120, the tag 120 further decodes this address and outputs a 2-bit way address WA0, WA1. As a result, one way is selected from the four ways read simultaneously, and 4-bit data DQ1-DQ4 is read out in parallel.

Data is read from the DRAM section 210 at a cache miss when the external address does not coincide with every address stored in the tag 120. The data reading is carried out in a way similar to access to an ordinary DRAM. That is, data is read by using the address signals A0-A8 as a row address signal and the address signals A9-A17 as a column address signal, and in response to the control signals $\overline{RAS}$ and $\overline{CAS}$ from the DRAM controller 130.

At a cache miss, the block (32 bits: corresponding to one way) in the DRAM section 210 including the 4 bits to which access has been made is transferred to the SRAM section 220 through the internal data bus 230. Timing of this transfer is controlled by the control signal $\overline{BT}$ from the cache controller 110. The replacement logic processor included in the tag 120 determines to which of the ways in the SRAM section 220 the transferred block data should be written. That is, the tag 120 generates the way address WA0, WA1 for selecting a way in the SRAM section 220.

In rewriting of data in the SRAM section (cache memory) 220, data of corresponding memory cells in the DRAM section 210 are also rewritten simultaneously (i.e. a write-through mode). Data writing to the DRAM section 210 is carried out in the same way as access to an ordinary DRAM. In this case, however, whether the written data is transferred also to the SRAM section 220 or not is optionally determined, and the choice is made through the transfer control signal $\overline{BT}$.

FIG. 2 shows a specific construction of the cache DRAM. This cache RAM construction shows circuitry relating to data reading, which is shown in 1989 SYMPOSIUM ON VLSI CIRCUITS, DIGEST OF TECHNICAL PAPERS, pages 43–44, for example.

Referring to FIG. 2, the DRAM section 210 includes a DRAM cell array 211 having a capacity of 1M ($2^{20}$) bits, a row decoder 212 for selecting one row in the DRAM cell array 211 in response to an externally applied row address A0–A8, a column decoder 213 for selecting 32 columns in the DRAM cell array 211 in response to 6-bit column address A9–A14 in an externally applied column address A9–A17, a DRAM sense amplifier 214 for detecting and amplifying data of memory cells in one row selected by the row decoder 212, an I/O gate 215 for connecting the selected columns to the internal data bus 230 in response to output of the column decoder 213, and a ⅛ decoder 231 for selecting four data lines from the 32-bit data lines in the internal data bus 230 in response to 3-bit column address A15–A17 in the externally applied column address.

The SRAM section 220 includes a SRAM cell array 221 having an 8K bit storage capacity, a set decoder 222 for receiving 6-bit set address A9–A14 among en externally applied cache address (the column address) A9–A17, and selecting one set or one row from the 64 sets in the SRAM cell array 221, a SRAM column decoder 213 for selecting 16 columns from the selected set in response to 3-bit address A15–A17 among the cache address A9–A17, an SRAM sense amplifier 294 for detecting and amplifying the data in the columns selected by the SRAM column decoder 213, a first way decoder 216 for selecting 4-bit data of one way from the 16-bit data of the four ways in response to an externally applied way address WA0, WA1, and a second way decoder 294 for selecting a way in the SRAM cell array 221 to be written with the 32-bit data transferred from the DRAM section 210 in response to the way address WA0, WA1 at a cache miss, and writing the 32-bit data to a selected way.

A hit/miss buffer 232 is provided for selecting either the DRAM section 210 or the SRAM section 220 in response to a cache hit/miss indicating signal H/M. This hit/miss buffer 232 not only buffers the cache hit/miss indicating signal H/M to generate a control signal for controlling operation of the first way decoder 216, but also maintains the output DQ0 to DQ4 at a high impedance until DRAM data is read and transmitted at a cache miss. Further, the hit/miss buffer 232 selects either the ⅛ decoder or the first way decoder in response to the cache hit/miss indicating signal H/M. Operations will be described next.

(i) At hit read

When a cache address A9–A17 is applied to the SRAM section 220, the SRAM section 220 is activated regardless of a cache hit/miss. The set decoder 222 decodes the 6-bit set address A9–A14 in the cache address A9–A17, and selects one set in the SRAM section 220. Since the selected set includes four ways and each way has 8 bits, 32-bit memory cells in total are selected simultaneously. Subsequently, the column decoder 223 decodes the 3-bit column address A15–A17, and selects one of the eight rows in one set. As a result, 16-bit memory cells in total are selected, with 4 bits selected from each way. The data of the 16-bit memory cells are amplified by the sense amplifier 295 and are then transmitted to the first way decoder 216.

At a time of cache hit, the way address WA0, WA1 is applied to the first way decoder 216. Based on the way address WA0, WA1, the first way decoder 216 selects one of the four ways and applies 4-bit data of the selected way to the hit/miss buffer 232. The hit/miss buffer 232, in response to a hit signal H, selects the 4-bit data from the first way decoder 216, and outputs the data as output data DQ1–DQ4.

(ii) At a hit write

When the column address A0–A8 and cache/column address A9–A17 are applied to the cache DRAM, the DRAM section 210 and SRAM section 220 are activated. In response to a hit indicating signal H and a write instruction signal, the hit/miss buffer 232 applies external data DQ1–DQ4 to the first way decoder 216 and ⅛ decoder 231. In the SRAM section 220, the first way decoder 216 selects four bus lines in the 16-bit wide data bus in response to the way address WA0, WA1, and transmits the 4-bit data to the SRAM cell array 221 through the sense amplifier 295. At a data writing, the sense amplifier 295 does not operate and the data for writing is simply transmitted to the SRAM cell array 221. The set decoder 222 selects one set in the SRAM cell array, while the SRAM column decoder 223 selects four columns in the selected set. At this time, the second way decoder 294 also operates to select and activate only one of the four ways. As a result, 4-bit data is written to the columns corresponding to the selected way.

In parallel with the operation for the SRAM section 220, data is written to the DRAM section 210. Though a data writing path to the DRAM section 210 is not expressly shown, the ⅛ decoder 231 selects four bus lines in the 32-bit internal data bus 230, and the data DQ1–DQ4 for writing is transmitted through the four selected bus lines. The remaining bus lines are maintained at a high impedance.

At a time of the data transfer for writing, 4-bit memory cells are already selected in the DRAM section 210 by the row address A0–A8 and column address A9–A17. The DRAM decoders 212 and 213 select 32 bits simultaneously, and the data for writing appears on only 4 bits among the 32 bits. The remaining data bus lines are at the high impedance, and the latching function of the DRAM sense amplifier 214 prevents adverse effect on the non-selected bits.

The operation for writing data to the SRAM cell array 221 and writing data to the corresponding memory cells (bits) in the DRAM cell array 211 at the same time is called a write-through mode.

(iii) At a miss read

A reading operation in the SRAM section 220 based on the cache address A9–A17 is the same as for hit read until the way address WA0, WA1 is applied to the first way decoder 216.

At a cache miss, the way address WA0, WA1 is not applied to the first way decoder 216 and the latter remains inoperative.

At this time, the external control signals RAS and CAS cause the DRAM section 210 active to take the row and column addresses A0-A8 and A9-A17 therein. The DRAM row decoder 212 and DRAM column decoder 213 decode the address A0-A17, and 32-bit data (one block) including the addressed 4-bit data are read out for transmission to the internal data bus 230.

The ⅛ decoder 231, in response to the 3-bit address A15-A17, selects 4 bits from the 32-bit them to the hit/miss buffer 232. In response to a cache miss signal M, the hit/miss buffer 232 selects the data received from the ⅛ decoder 231, and sets the output data DQ1-DQ4, which have been in the high impedance, to potential levels corresponding to the received data.

In parallel with this data reading, the way address WA0, WA1 is applied to the second way decoder 4 at a cache miss, after a fall of the signal $\overline{RAS}$, i.e. after an operation of the DRAM section 210. The second way decoder 294 also receives the 32-bit data from the internal data bus 230. The second way decoder 294 is activated by the transfer control signal $\overline{BT}$ to decode the way address WA0, WA1 and select a way. 32-bit data transferred from the DRAM section 210 is written to one of the four ways selected by the set decoder 222 and SRAM column decoder 223. As a result, data in the corresponding memory cells in the SRAM cell array are renewed.

(iv) At a miss write

The cache miss signal M is applied along with a write instruction signal (not shown) to the cache DRAM. At a cache miss, the signals $\overline{RAS}$ and $\overline{CAS}$ activate the DRAM section 210 to select memory cells in the DRAM section 210 in accordance with the row address A0-A8 and column address A9-A17. The hit/miss buffer 232 does not select the SRAM section 220 but selects the DRAM section 210, or selects only the ⅛ decoder 231. As a result, input data DQ1-DQ4 is written to the 4-bit DRAM memory cells corresponding to the external address A0-A17.

At this time, the SRAM section 220 engages only in a memory cell selecting operation by means of the set decoder 222 and SRAM column decoder 223. At the miss write, whether the 4-bit data written to the DRAM section 210 is to be transferred to the SRAM section 220 or not is optional, and the choice is made through the transfer control signal $\overline{BT}$.

The basic concept of the conventional cache DRAM is such that a part of the data in the DRAM cell array 211 are stored in the SRAM cell array 221 and, upon an access request from an external processor, (i) the SRAM cell array 221 is accessed for data reading or writing if corresponding data is stored in the SRAM cell array 221, and (ii) if corresponding data is not found in the SRAM cell array 221, access is made to the DRAM cell array 211 in response to the cache miss signal for reading or writing the data to/from the DRAM cell array 211.

Generally, access time of the SRAM is 10 to 20 ns which is faster than that of the DRAM. However, the memory cells in the SRAM have a flip-flop type construction, and at least four transistors are required for each cell. The SRAM is inferior in the degree of integration and cost per bit to the DRAM which requires one transistor for each cell. However, the DRAM generally has an access time of 50 to 100 ns, which is slower than the SRAM.

The cache DRAM has been devised to compensate for the drawbacks of the DRAM and SRAM while retaining the advantages of the two. According to this construction, an average access time may virtually be reduced to the same level as that of the SRAM if the data to which access is requested from an external processor is present in the SRAM section with a very high probability. In this way, a large-capacity, high-speed memory device may be realized which has a degree of integration comparable to the DRAM and an access time comparable to the SRAM.

However, the conventional cache DRAM requires a tag that compares the address of the memory cell requested by an external processor and the address of each data block stored in the SRAM section, and determines from the result of this comparison whether or not the requested data (or data block) is present in the SRAM section. This poses a problem of enlarging the device scale.

There is a mode called a write-back mode which is an improvement in system efficiency to the write-through mode noted hereinbefore which writes data to the DRAM section each time the data is written to the SRAM section. According to the write-back mode as employed in a processing system having main memory and cache memory, generally, data are written only to the cache memory and the newly written data are transferred in a batch to the main memory later on. Since the main memory is slower than the cache memory and requires a long time for data writing, the write-back mode for writing data in a batch from the cache memory to the main memory provides a shorter total cycle time than the write-through mode does.

However, the write-back mode requires a buffer for storing the addresses for the cache memory to which data have been rewritten, and a control circuit for maintaining consistency in operation (writing timing, operating speed and others) between cache memory and main memory. In the cache DRAM, the DRAM corresponds to the main memory in an ordinary system, and the SRAM to the cache memory. To effectuate the write-back mode in the conventional cache DRAM, therefore, it is necessary to add, as external components, a buffer for storing the addresses of the memory cells in the SRAM section having the data renewed, and a control circuit for controlling the batch transfer of the renewed data from the SRAM section to the DRAM section. This results in an enlarged device and complicated setting of the control timing. Thus, it is difficult to realize the write-back mode in the conventional cache DRAM by means of a simple construction.

Further, the tag must include, in addition to the tag memory for storing the addresses of data stored in the SRAM section, the replacement logic processor for selecting a way to which a new data is written at a cache miss, and the comparator for determining a cache hit/miss. Consequently, it is difficult to realize a tag with a simple construction.

SUMMARY OF THE INVENTION

An object of this invention is to provide an improved semiconductor memory device containing cache which eliminates the drawbacks of the conventional semiconductor memory device containing cache.

Another object of this invention is to provide a semiconductor memory device containing cache which does not require a tag as an external component for determining a cache hit/miss.

Yet another object of this invention is to provide a semiconductor memory device containing cache which can support the write-back mode with ease.

A further object of this invention is to provide an improved operating method for a semiconductor memory device containing cache.

A still further object of this invention is to provide an operating method for a semiconductor memory device containing cache, which increases the data read/write speed at a cache hit.

A still further object of this invention is to provide an operating method for a semiconductor memory device containing cache, which carries out the write-back mode with ease.

A semiconductor memory device containing cache according to this invention comprises a DRAM cell array including a plurality of dynamic memory cells arranged in a matrix of rows and columns, an SRAM cell array including a plurality of static memory cells arranged in a matrix of rows and columns, a transfer device for carrying out data transfer between the DRAM cell array and SRAM cell array, and a match/mismatch detecting device for addresses of data stored in the SRAM cell array, comparing an externally applied address and the addresses stored therein, and generating a signal indicative of a comparison result.

The semiconductor memory device according to this invention further includes a first device responsive to a match detection signal from the match/mismatch detecting device for connecting the memory cells in the SRAM cell array corresponding to the external address to an internal data transmission line, and a second device responsive to a mismatch detection signal from the match/mismatch detecting device for making access to the DRAM cells to select the memory cells corresponding to the external address and connect the selected memory cells to the internal data transmission lines.

The first device includes a device responsive to the match detection signal from the match/mismatch detecting device for directly driving the rows in the SRAM cell array. This direct drive device includes a device for transmitting a signal for driving a row in the SRAM cell array generated in response to an external address, to the row in the SRAM cell array in response to the match detection signal.

The semiconductor device containing cache according to this invention further includes an internal row address generating device responsive to an externally applied row addresses for generating an internal row address and applying at least a part thereof to the match/mismatch detecting device, and a column selecting signal generating device responsive to column address externally applied at substantially the same timing as the external row address for generating a signal for selecting a column in the DRAM cell array. The column selecting device and match/mismatch detecting device are operable in parallel. The column selecting device includes a device for generating a row drive signal for selecting a row in the SRAM cell array.

The match/mismatch detecting device includes a CAM cell array having match detection lines extending in a row direction, data input lines extending in a column direction, a plurality of content addressable memories arranged at respective crossings between the match detection lines and data input lines, and a plurality of CAM word lines extending in the row direction for selecting one row of the content addressable memories. The rows and columns of this CAM cell array are provided corresponding to those of the SRAM cell array. The content addressable memories in one row store an address of data stored in the SRAM cell array.

The match/mismatch detecting device applies the match detection signal to the first device to drive a corresponding row in the SRAM cell array, and includes a device for generating a signal indicative of a cache hit/miss in response to a signal potential on the rows in the SRAM cell array.

The second device includes a device responsive to the mismatch detection signal from the detecting device for temporarily disregarding the internal address applied to the detecting device, reading from the detecting device address corresponding to the external address, selecting corresponding dynamic memory cells in the DRAM cell array and corresponding static memory cells in the SRAM cell array in response to the address thus read out, and writing the data read from the selected static memory cells to the selected dynamic memory cells through the transfer device.

The second device includes a device for activating the external address again after the data transfer from the SRAM cell array to the DRAM cell array, storing the external address in a memory of the detecting device, selecting memory cells in the DRAM cell array corresponding to the external address and connecting the selected memory cells to the internal data transmission line.

The DRAM cell array is divided into a plurality of blocks one for each plurality of the columns. The SRAM cell array and CAM cell array are also divided into a plurality of blocks corresponding to the blocks of the DRAM cell array. The match/mismatch detecting operation is carried out on the block by block basis.

In the memory device according to this invention, the addresses of data stored in the SRAM cell array as cache memory are stored in the detecting device. The detecting device detects a match/mismatch between the stored addresses and an external address. Thus, a cache hit/miss is determined within the semiconductor memory device.

Where the address memory of the detecting device comprises content addressable memory cells, a match/mismatch between the stored data address and external address may be detected without an additional dedicated comparator. With the match detection lines arranged in a one-to-one relationship with the rows in the SRAM cell array, the rows in the SRAM cell array may be driven at high speed at a cache hit.

The application of the row and column addresses to the semiconductor memory device substantially at the same timing allows the detecting operation by the detecting device and the operation for selecting the column and row in the DRAM cell array or SRAM cell array to be carried out in parallel. This will further expedite determination of a cache hit/miss, and realize access time and cycle time comparable, despite the detecting operation of the detecting device, to those of a cache DRAM including no such detecting device.

Further, a hierarchical structure is employed for paths for transmission of cache hit/miss signal, i.e. a path for applying the signal from the detecting device to the first device, and a path for generating the signal determining a cache hit/miss in response to word line (row) potentials of the SRAM cell array. This simplifies the entire device and facilitates layout of the detecting device. At a cache hit determination, the memory cell selecting operation for the SRAM cell array is substantially completed, which increases the access time of this semiconductor memory device.

At a cache miss, the data are always transferred for writing from the SRAM cell array to the DRAM cell array. At this time, the addresses stored in the detecting device are used for selection of the SRAM cell array and DRAM cell array. This realizes a write-back operation for transferring data from the SRAM cell array to the DRAM cell array easily without necessitating an extra memory circuit for the write-back and a complicated timing control circuit.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
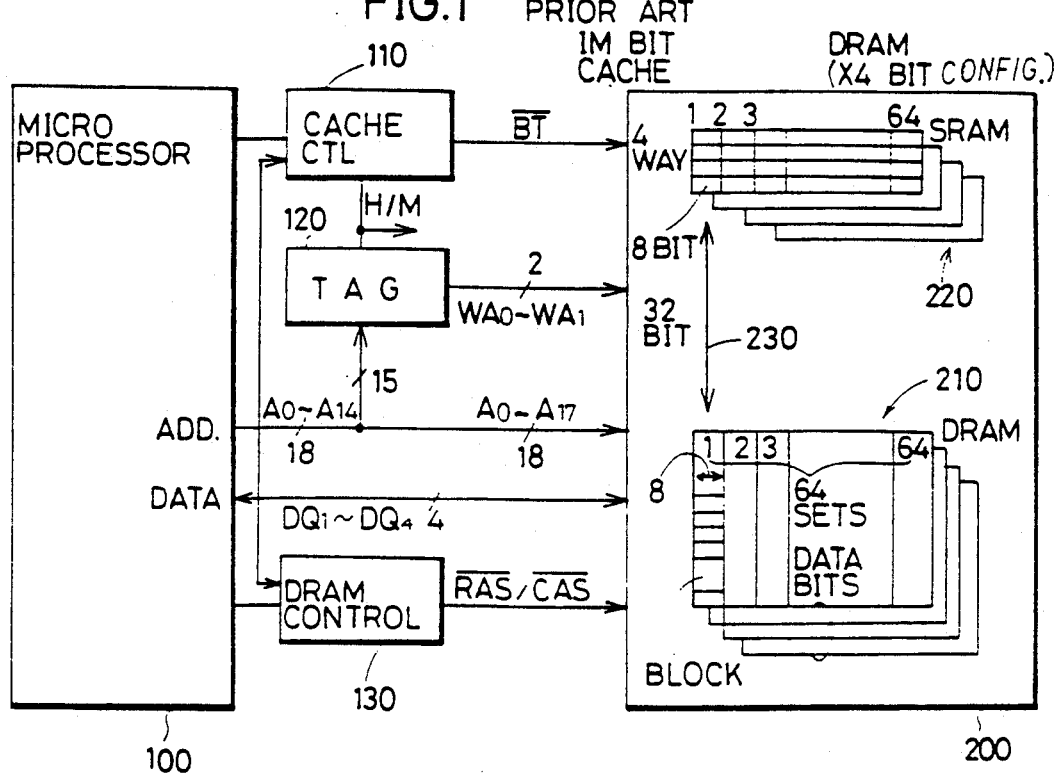
FIG. 1 is a diagram showing a conceptual construction of a processing system using a conventional semiconductor memory device containing cache.
Figure 2:
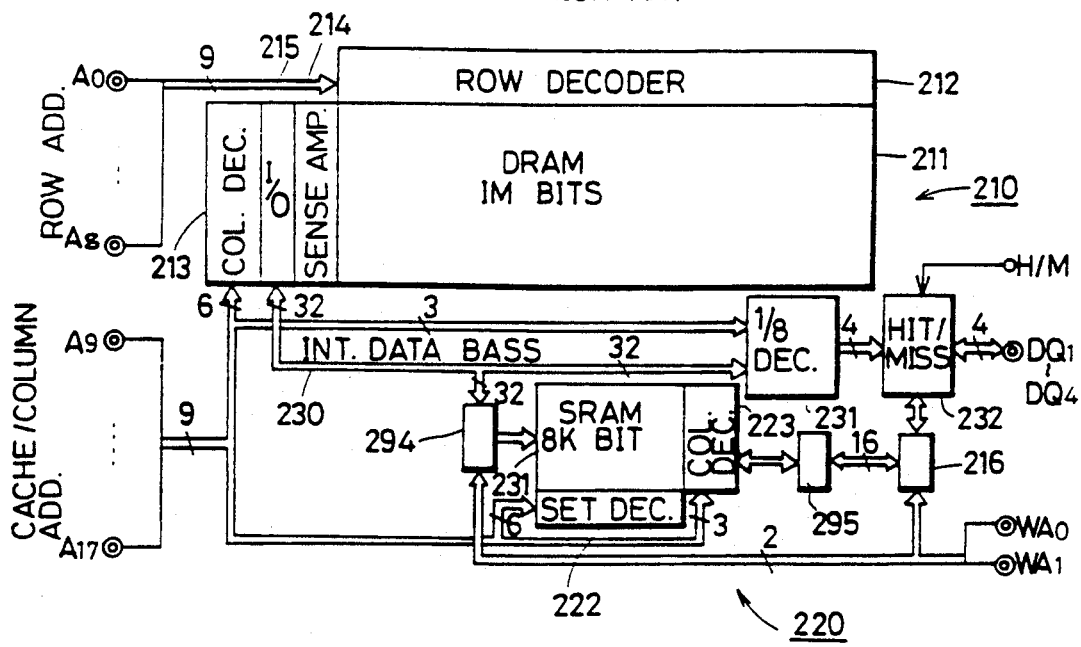
FIG. 2 is a diagram showing an overall construction of the conventional semiconductor memory device containing cache.
Figure 3:
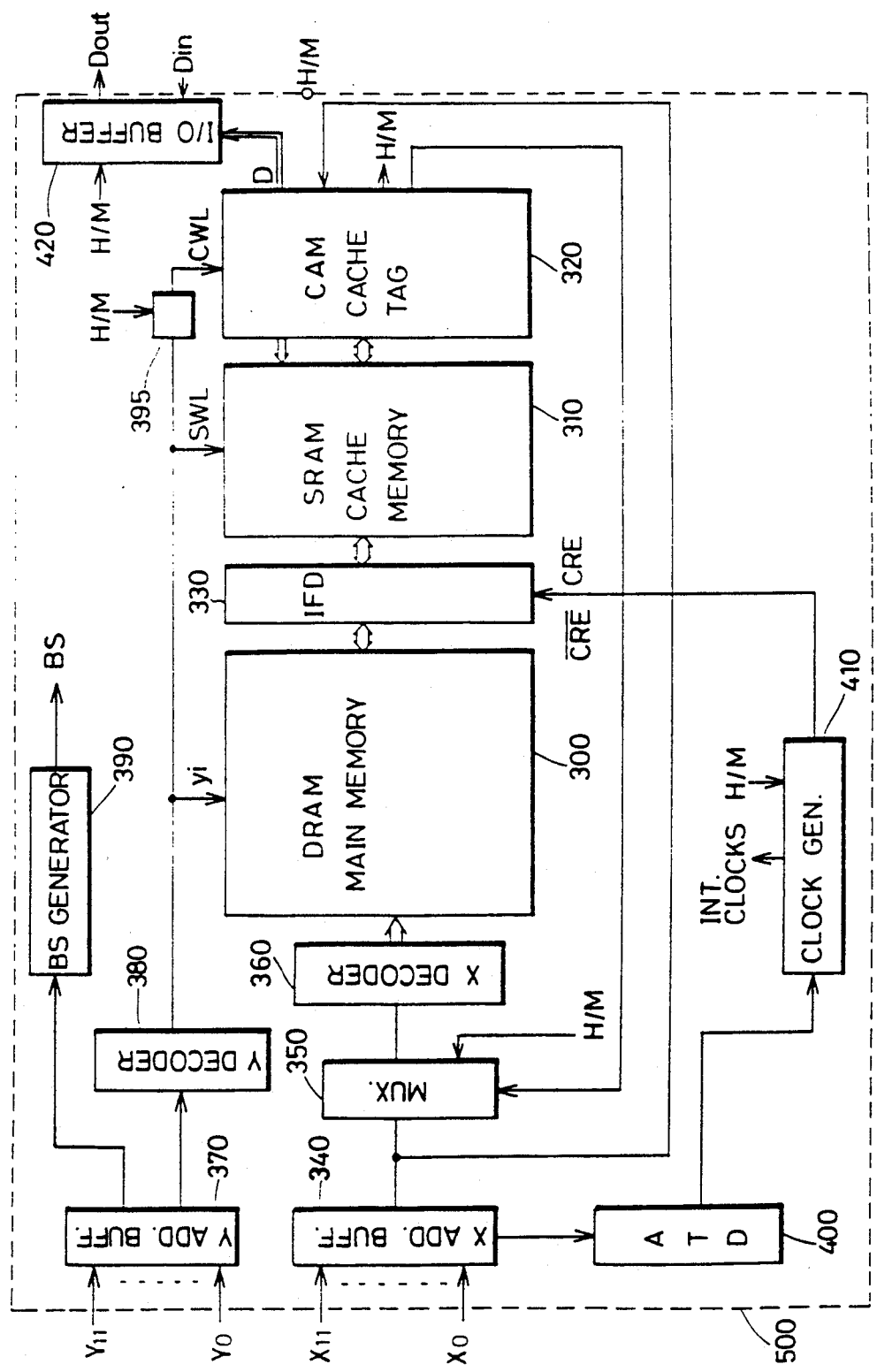
FIG. 3 is a diagram showing an overall construction of a semiconductor memory device containing cache according to one embodiment of this invention.

FIG. 3 schematically shows an overall construction of a semiconductor memory device according to one embodiment of this invention. Referring to FIG. 3, the semiconductor memory device containing cache according to this invention includes a DRAM cell array 300 as main memory, an SRAM cell array 310 as cache memory, and a CAM (content addressable memory) matrix 320 as cache tag.

The DRAM cell array 300 includes a plurality of dynamic memory cells arranged in a matrix of rows and columns, and is divided into blocks each plurality of the columns.

The SRAM cell array 310 includes a plurality of static memory cells arranged in a matrix of rows and columns, and is divided into blocks corresponding to the blocks in the DRAM cell array 300.

The CAM matrix 320 stores addresses (tag addresses) of data stored in the SRAM cell array 310, determines a match/mismatch between the stored data and newly input data, namely a cache hit/miss, and outputs a signal H/M indicative of a result of the cache hit/miss determination.

An interface driver band 330 is provided for data transfer between the DRAM cell array 300 and SRAM cell array 310 on a cache miss and a write-back.

Peripheral circuits include an X-address buffer 340, a multiplexer 350, an X-decoder 360, a Y-address buffer 270, a Y-decoder 380, a BS generator 390, and a CWL generator 395.

The X-address buffer 340 receives externally applied 12-bit X-address X0–X11, and generates complementary internal X-address X0, $\overline{X0}$–X11, $\overline{X11}$ for application to the CAM cell array 320 and multiplexer 350. It is assumed here that the DRAM cell array 300 has a 16M-bit storage capacity.

The multiplexer 350, in response to the cache hit/miss signal H/M, allows selective passage of either the internal X-address received from the X-address buffer 340 or X-address generated by the CAM cell array 320 on a cache miss.

The X-decoder 360 decodes the internal X-address to select one row in the DRAM cell array 300.

The Y-address buffer 370 receives externally applied 12-bit Y-address Y0–Y11, and generates internal Y-address. It is assumed here that this semiconductor memory device inputs and outputs data in a unit of one bit. The Y-decoder 380 decodes the internal Y-address, and generates a column selecting signal Yi for selecting a corresponding column or columns in the DRAM cell array (one column for ×1 bit configuration and four columns for ×4 bit configuration), a signal SWL for driving row lines in the SRAM cell array 310 (SRAM word lines), and a signal CWL for driving row lines in the CAM cell array 320 (CAM word lines). As will be described in detail later, each block in the SRAM cell array 310 and CAM matrix 320 is divided into groups, and the SRAM word line drive signal SWL and CAM word line drive signal CWL act also as group selecting signals.

The BS generator 390, in response to the internal Y-address from the Y-address buffer 370, generates block selecting signal BS for selecting blocks in the SRAM cell array 310 and CAM cell array 320.

The CWL generator 395, in response to the cache hit/miss signal H/M from the CAM cell array 320, allows selective passage of the CAM word line drive signal CWL transmitted from the Y-decoder 380. The CWL generator 395 outputs the drive signal CWL only on a cache miss.

The peripheral circuits further includes an address transition detector 400 for receiving the internal X-address from the X-address buffer 340 to detect a point of time of transition in the X-address and generate a signal for specifying operating cycle of the semiconductor memory device, a clock generator 410 operable in response to the control signal from the address transition detector 400 and the cache hit/miss signal H/M for generating internal clock pulses and transferring instruction signals CRE and $\overline{CRE}$ for controlling operation of the interface driver band 330, and an input/output buffer 420 for inputting and outputting data.

The input/output buffer 420, when the cache miss signal M is produced, maintains its output terminal at a high-impedance until correct data is produced, that is, until data is read from the DRAM cell array 300. This is effective to prevent malfunctioning of external devices.

The address transition detector 400 may be constructed to detect a point of time of transition in the external X-address X0-X11 and/or external Y-address Y0-Y11 instead of the internal X-address from the X-address buffer 340.

The X-address X0-X11 and Y-address Y0-Y11 are applied to the X-address buffer 340 and Y-address buffer 370 substantially at the same timing, respectively.

This semiconductor memory device is formed on a semiconductor chip 500 as an integrated unit. The cache hit/miss signal H/M from the CAM cell array 320 is also led out to enable external monitoring of cache hit/miss states.

Figures 4A, 4B:
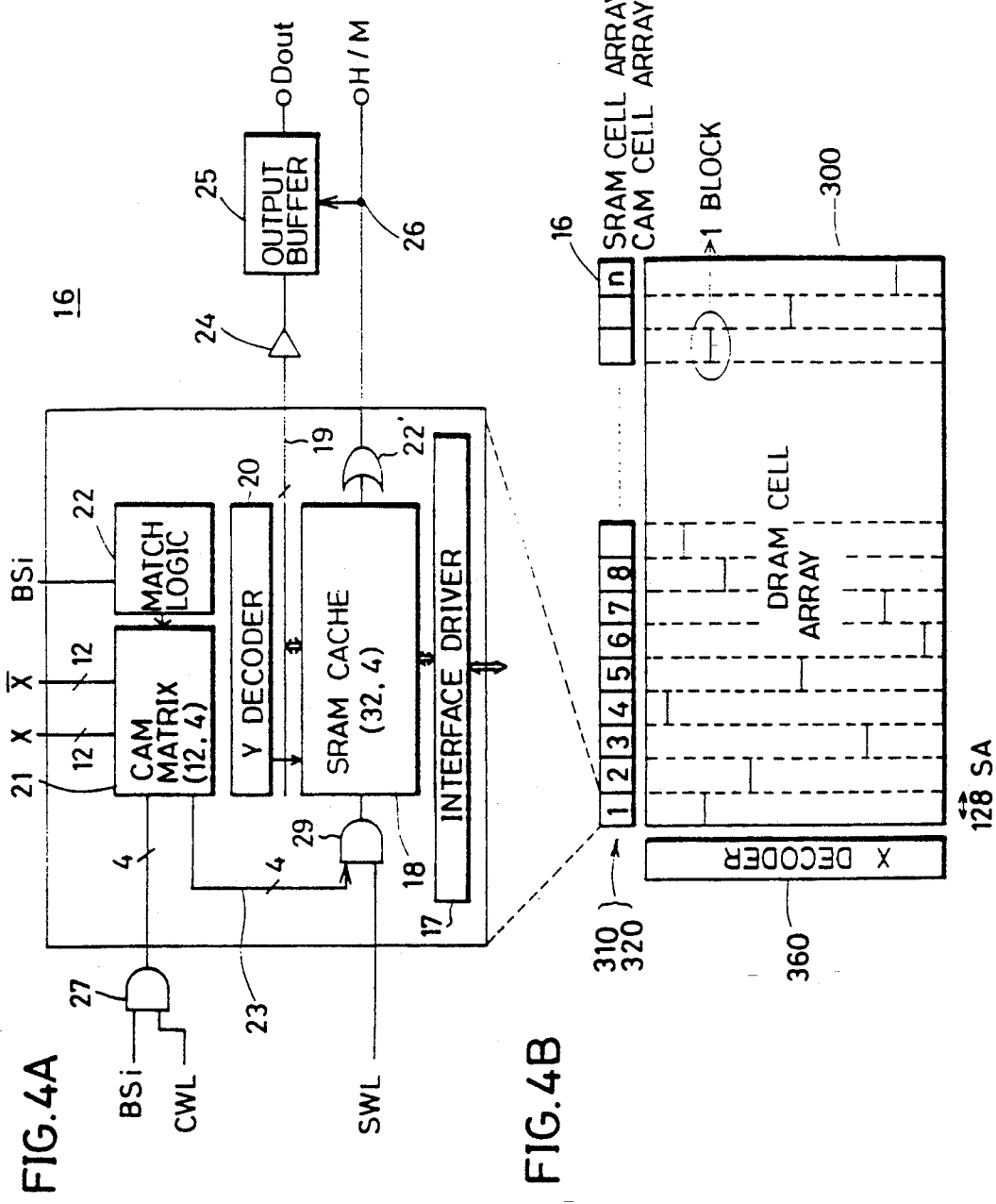
FIG. 4A is a diagram showing a construction of a cache element including a SRAM cache and a CAM matrix according to one embodiment of this invention.
FIG. 4B is a diagram showing a relationship between a DRAM cell array and cache elements.

FIGS. 4A and 4B schematically show a construction of a principal portion of the semiconductor memory device shown in FIG. 3. FIG. 4A is a functional illustration of a cache element 16 comprising each single block of the SRAM cell array and CAM cell array. FIG. 4B shows a relationship between the DRAM cell array 300 and cache elements 16.

Referring to FIG. 4B first, the DRAM cell array 300 is divided into n blocks each including 128 columns (one column including one sense amplifier SA, and hence a total of 128 sense amplifiers). Where the DRAM cell array 300 has a 16M-bit storage capacity as noted hereinbefore and has a cell matrix construction of $2^{12}$ (4096) rows by $2^{12}$ columns, $n=2^5=32$. The number of blocks n is determined by the matrix construction of the DRAM cell array.

The cache elements 16 are arranged to correspond to the respective blocks in the DRAM cell array 300. Each cache element 16 includes a plurality of SRAM cells and a plurality of CAM cells.

Referring to FIG. 4A, each cache element 16 includes an SRAM cache 18 for storing data of memory cells in a selected row in a corresponding DRAM cell block, and a CAM matrix 21 for storing addresses of the data stored in the SRAM cache 18. The SRAM cache 18 has a construction of 32 bit word by 4 groups to be capable of storing memory cell data corresponding to four different X-addresses. The CAM matrix 21 has a construction of 12 bit word by 4 groups, each group storing address of the data in each group in the SRAM cache 18. One group in the CAM matrix 21 has the 12-bit word construction since the DRAM cell array 300 has a 16M-bit storage capacity and the X-address are 12 bits. Where the DRAM cell array has a 64M-bit storage capacity or a 1M-bit storage capacity, the X-address is X0-X7 or X0-X9. Then, the CAM matrix 21 has a construction of 8 bit word by 4 groups or 10 bit word by 4 groups, respectively. In the following description, the X-address is assumed to be 12 bits, i.e. X0-X11.

The cache element 16 further includes a gate circuit 27 for allowing selective passage of the CAM word line drive signal CWL in response to a block selecting signal BSi, a match logic circuit 22 activated by the block selecting signal Bsi to drive the CAM matrix 21, and operable in response to output of the CAM matrix 21 for determining a cache hit/miss and generating the cache hit/miss signal H/M based on the result of the determination, an SRAM word driver 29 operable in response to a signal potential on a first match detection line (local match line) 23 from the CAM matrix 21 for allowing selective passage of an SRAM word line drive signal SWL for application to the SRAM cache 18, and a gate circuit 22' operable in response to word line potentials of the SRAM cache 18 for transmitting a signal indicative of a cache hit/miss to a second match detection line (main match line) 26. The gate circuit 22' is included in the match logic circuit 22 in an actual circuit construction.

The SRAM word line is a signal line for selecting memory cells in one row of the SRAM cache 18, while the CAM word line is a word line for selecting memory cells in one row of the CAM matrix 21. The block selecting signal BSi is a block selecting signal applied to an i-th block. Block selecting signals will be described generally by a reference symbol BS.

Further, the cache element 16 includes an interface driver 17 for performing data transfer between the SRAM cache 18 and corresponding DRAM cell array block, and a unit Y-decoder 20 operable in response to a column selecting signal Yi for selecting a corresponding column in the SRAM cache 18 and a corresponding column in the DRAM cell array and connecting the selected column to an I/O bus 19. The I/O bus 19 includes a pair of bus lines where the semiconductor memory device has a x1 construction, and four groups of bus lines where the latter has a x4 construction. In the case of x4 construction, the unit Y-decoder 20 simultaneously selects four columns in the SRAM cache 18 and in a DRAM cell array block, respectively. Thus, the number of bus lines in the I/O bus 19 is dependent on the construction of the semiconductor memory device. In the following description, it is assumed that data are input and output in a unit of 1 bit.

To output data on the I/O bus 19, there are provided a preamplifier 24 for amplifying the data on the I/O bus 19, and an output buffer 25 for outputting the data amplified by the preamplifier 24 as external data Dout. The output buffer 25 sets its output to "Z (high-impedance)" when the signal on the main match line 26, that is the cache hit/miss signal, indicates a cache miss.

Though a data writing path is not clearly shown, data are similarly transmitted from an input buffer included in the input/output buffer 420 shown in FIG. 3, through this I/O bus line and through a preamplifier directed opposite to the preamplifier 24, to the internal I/O line 19.

Figure 5:
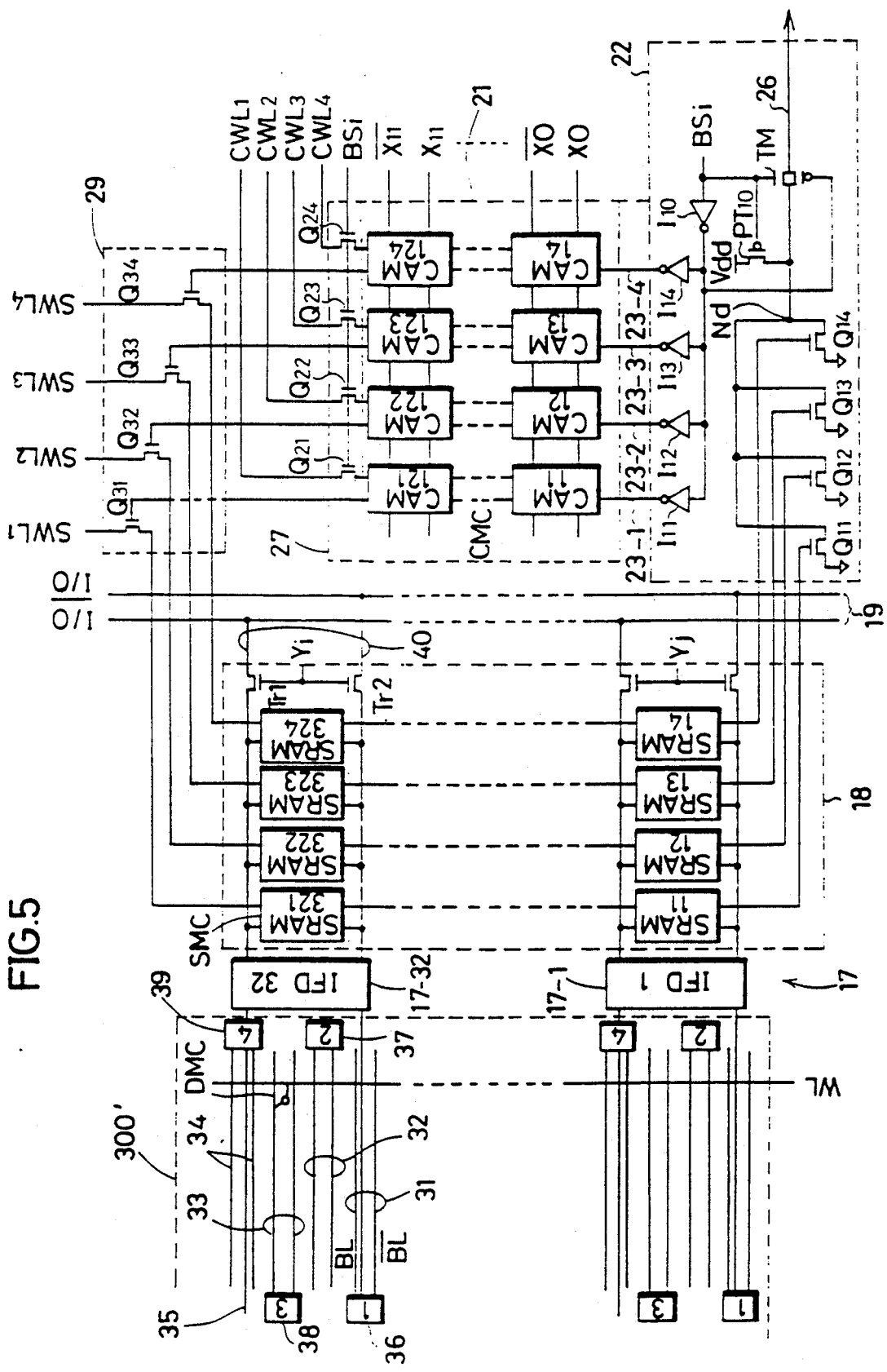
FIG. 5 is a diagram showing a construction of a principal portion of the semiconductor memory device containing cache according to one embodiment of this invention.

FIG. 5 is a diagram showing a specific construction of the cache element 16. Referring to FIG. 5, a DRAM cell array block 300' is divided into 32 groups in total, each group including four bit line pairs 31, 32, 33 and 34. Each of the bit line pairs 31–34 includes a bit line pair (DRAM bit lines) BL, $\overline{BL}$ for transmitting complementary data.

The DRAM cell block 300' further includes sense amplifiers 36, 37, 38 and 39 associated with the respective bit line pairs for detecting and amplifying signal potentials on the corresponding bit line pairs. Since 128 memory cells are connected in one row, 128 sense amplifiers 36–39 are provided in total. The sense amplifiers 36–39 are arranged at opposite ends of the bit line pairs in an alternating way. This arrangement extends the pitch between adjacent sense amplifiers to the pitch between two adjacent bit line pairs, thereby realizing a high density memory cell array without enlarging a memory cell chip area. The sense amplifier arrangement employed in this DRAM array is shown in "A 60 ns 3.3V 16 Mb DRAM", IEEE ISSCC 89 Digest of Technical Papers, February 1989, page 244, by the same Inventors, K. Arimoto et al.

Dynamic memory cells DMC are arranged so as to be connected to a single word line (DRAM word line) per bit line pair. A pair of sub-I/O lines 35 is provided for the four bit line pairs 31–34. At a time of data writing/reading to or from the DRAM cells DMC, one bit line pair in one group of bit line pairs (i.e. four pairs of bit lines) is connected to a sub-I/O line 35.

Figure 6:
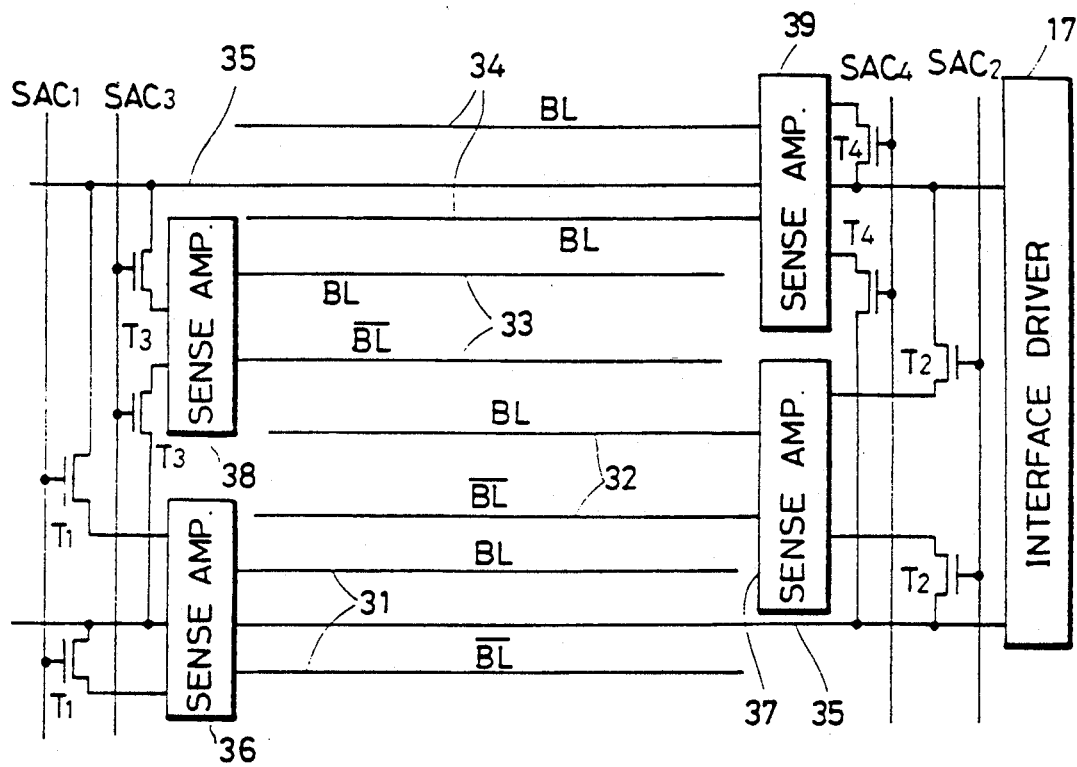
FIG. 6 shows details of a DRAM cell section shown in FIG. 5.

FIG. 6 shows greater detail of the arrangement of the bit line pairs in one group. As shown in FIG. 6, latch nodes of the sense amplifiers are selectively connected to the sub-I/O lines 35 by sense amplifier connecting signals SAC. Normally, the DRAM sense amplifier has a CMOS (complementary metal oxide semiconductor) flip-flop construction which differentially detects, amplifies and latches potentials on a bit line pair.

Specifically, the latch nodes of the sense amplifier 36 are connected to sub-I/O lines 35 through switching transistors (n-channel MOS transistors) T1 in response to a sense amplifier connecting signal SAC1. The sense amplifier 37 has latch nodes connected to the sub-I/O lines 35 through switching transistors T2 in response to a sense amplifier connecting signal SAC2. The latch nodes of the sense amplifier 38 are connected to the sub-I/O lines 35 through switching transistors T3 in response to a sense amplifier connecting signal SAC3. The latch nodes of the sense amplifier 39 are connected to the sub-I/O lines 35 through switching transistors T4 in response to a sense amplifier connecting signal SAC4.

The sense amplifier connecting signals SAC (SAC-1–SAC4) are generated from the Y-decoder (FIG. 3) in the same way as the signal for selecting the word lines in the SRAM cell array. These sense amplifier connecting signals are formed by using the two least significant bits in the Y-address, for example. According to this construction only the latch nodes of one sense amplifier, therefore only one bit line pair, are connected to the sub-I/O lines 35 at any given time.

Referring to FIG. 5 again, the SRAM cache 18 includes 128 SRAM cells (static memory cells) SMC to correspond to the 128 columns in the DRAM cell block 300. The 128 SRAM cells SMC are divided into four groups so that each group includes 12 SRAM cells. That is, 12-bit SRAM cells SMC are connected to a single SRAM word line SWL (the same reference being affixed to the word line drive signal and word line), and 4-bit SRAM cells to a pair of SRAM bit lines 40. The grouping of the SRAM cells in the SRAM cache 18 corresponds to the grouping of the sense amplifiers or bit line pairs in the DRAM cell array.

The SRAM cache 18 further includes I/O gates Tr1 and Tr2 for connecting the corresponding SRAM bit line pair 40 to the I/O bus 19 in response to column selecting signals Yi . . . Yj. The Y-decoder (Y-decoder 380 and unit Y-decoder) 20 is provided commonly for the DRAM cell array and SRAM cell array, and the I/O gates Tr1 and Tr2 are used also for selecting a column in the DRAM cell array. Thus, data reading/writing from or to the DRAM cell array and date reading/writing from or to the SRAM cell array are always carried out through this I/O bus 19.

In the SRAM cache 18, a SRAM bit line pair 40 is connected to the sub-I/O lines 35 through an interface driver 17. This allows the SRAM memory cells SMC to be formed easily within the pitch of four DRAM cells.

The interface driver 17 includes unit interface drivers 17-1 to 17-32 arranged between the sub-I/O lines 35 and respective SRAM bit line pairs 40.

Figure 7:
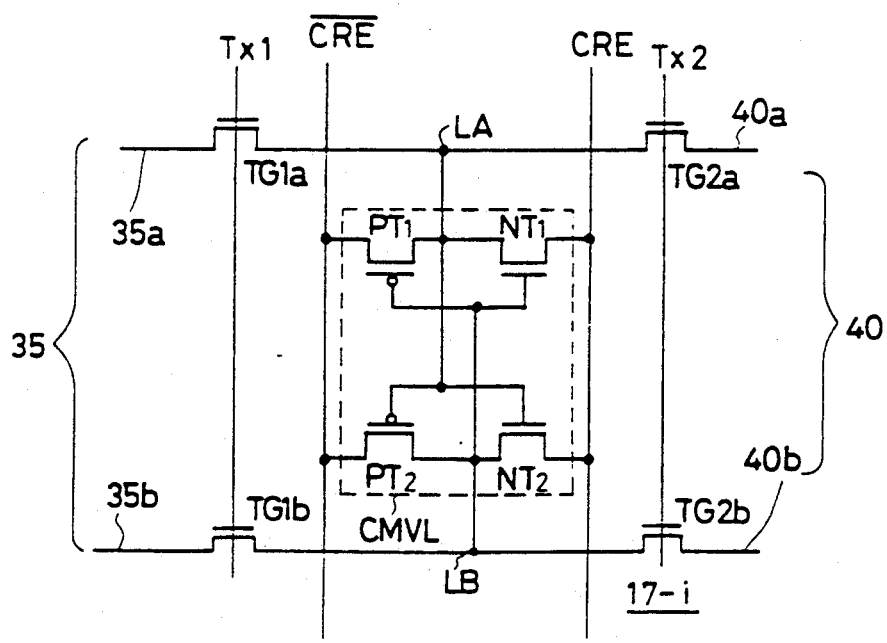
FIG. 7 is a diagram showing a specific construction of an interface driver shown in FIG. 5.

FIG. 7 is a diagram showing a specific construction of a unit interface driver. Referring to FIG. 7, the unit interface driver 17-i includes two CMOS inverters operable in response to transfer instruction signals CRE and $\overline{CRE}$. The first CMOS inverter includes a p-channel MOS transistor PT1 and an n-channel MOS transistor NT1 for inverting the signal potential on the sub-I/O line 35b (SRAM bit line 40b) for transmission to the other sub-I/O line 35a (the other SRAM bit line 40a). The second CMOS inverter includes a p-channel MOS transistor PT2 and an n-channel MOS transistor NT2 for inverting the signal potential on the other sub-I/O line 35a (the other SRAM bit line 40a) for transmission to the sub-I/O line 35b (the SRAM bit line 40b). The unit interface driver 17-i also includes a pair of transfer gates TG1a and TG1b operable in response to a first transfer control signal TX1 to connect the sub-I/O lines 35a and 35b to latching nodes LA and LB, respectively, and another pair of transfer gates TG2a and TG2b operable in response to a second transfer control signal TX2 to connect the latching nodes LA and LB to the SRAM bit lines 40a and 40b, respectively. The two CMOS inverters form a latch circuit CMVL activated by the transfer instruction signals CRE and $\overline{CRE}$. The first and second transfer control signals TX1 and TX2 are generated by the clock generator 410 shown in FIG. 3. Upon first generation of the transfer instruction signals CRE and $\overline{CRE}$, the second transfer control signal TX2 is first generated to connect the latching nodes LA and LB to SRAM bit lines 40a and 40b, and then the transfer instruction signals CRE and $\overline{CRE}$ are generated to activate the latch circuit CMVL for amplifying and latching the signal potentials at the latching nodes LA and LB, and then the first transfer control signal TX1 is generated to connect the latch nodes LA and LB to the sub-I/O lines 35a and 35b. Upon second generation of the transfer instructing signals CRE and $\overline{CRE}$, the first transfer control signal TX1 is first generated, and the transfer instruction signal CRE, $\overline{CRE}$ are generated, and the second transfer control signal TX2 is generated. The transfer control signals TX1 and TX2 may have a period in which they are both in an activated state. However, it is preferable for fast data transfer that when one of the transfer control signals TX1 and TX2 is activated, the other is in an nonactivated state. The interface drivers 17 are operable on a block basis, and only the one associated with a selected block is activated. This is controlled by the block selecting signal BS.

Referring to FIG. 5 again, the CAM matrix 21 includes 48 CAM (content addressable memory) cells CMC which are divided into four groups corresponding to the four groups in the SRAM cache 18. Each group of the CAM cells includes 12 CAM cells. The CAM matrix 21 has CAM word lines CWL (the same reference being affixed to the signal lines and the signals transmitted thereto as noted hereinbefore) for selecting the groups of CAM cells CMC, local match lines 23-1 to 23-4 for transmitting signals indicative of match/mismatch detection result of a selected CAM cell group, and data input lines for transmitting the internal X-address X0 $\overline{X0}$-X11, $\overline{X11}$. Twelve CAM cells CMC (i.e. CAM cells in one group) are connected to one CAM word line CWL and one local match line 23-k (k=1 to 4), and four CAM cells CMC to a pair of data input lines (internal address input lines) Xm, $\overline{Xm}$ (m=0 to 11).

The CAM word line selecting signal CWL is generated in the same way as the word line drive signal SWL for the SRAM cell array, but only at a cache miss.

Figure 8:
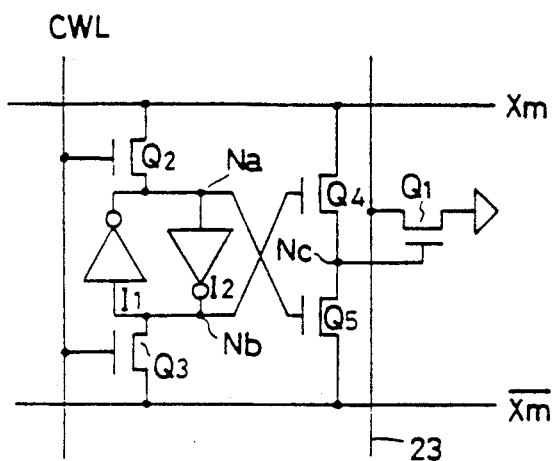
FIG. 8 is a diagram showing a specific construction of a CAM cell shown in FIG. 5.

FIG. 8 shows a specific construction of a CAM cell. Referring to FIG. 8, the CAM cell CMC includes a pair of inverters 11 and 12 connected in opposite directions between a node Na and a node Nb, switching transistors Q2 and Q3 formed, for example, of n-channel MOS transistors which become conductive in response to the signal potential on the CAM word line CWL for connecting the nodes Na and Nb to the data input line (address input line) Xm and complementary data input line $\overline{Xm}$, respectively, a switching transistor Q4 formed, for example, of an n-channel transistor operable in response to the signal potential of node Nb for electrically connecting the data input line Xm and a node Nc, a switching transistor Q5 formed, for example, of an n-channel transistor operable in response to the signal potential of node Na for electrically connecting the complementary address input line $\overline{Xm}$ and node Nc, and a switching transistor Q5 formed, for example, of an n-channel transistor operable in response to the signal potential of node Nc for discharging the potential of the associated local match line 23. This CAM cell retains the charge potential of the associated local match line when data stored in the nodes Na and Nb (signal potentials) equal the signal potentials of the address input lines (data input lines) Xm and $\overline{Xm}$, respectively, and discharges the potential of the local match line 23 in the event of unequality therebetween. The way in which this CAM cell operates will be described briefly.

Assume that data "H" are stored in the nodes Na and Nb. The local match line 23 is charged at "H" before a match detecting operation takes place. The potential of the CAM word line CWL is "L". It is assumed here that signal potentials "H" and "L" are transmitted to the data lines (address input lines) Xm and $\overline{Xm}$, respectively. In this case, the transistor Q5 is in conductive state and the transistor Q4 is in non-conductive state. The potential of node Nc becomes "L" through the transistor Q5 in conductive state, and the transistor Q1 becomes non-conductive. Consequently, the local match line 23 retains its charge potential.

On the other hand, when "L" and "H" signals are transmitted to the data input lines (address input lines) Xm and $\overline{Xm}$, respectively, the potential of node Nc becomes "H" through the transistor Q5 in conductive state, and the transistor Q1 becomes conductive. Consequently, the local match line 23 discharges its charge potential to become "L".

According to this construction, the potential of the local match line 23 becomes "H" in the event of equality between the data stored in the CAM cell and the signal potential on the data input line (address input line), i.e. the address, and becomes "L" in the event of unequality therebetween. In this way, a match/mismatch between the input address and stored address is detected at high speed.

Data writing and reading to/from the CAM cells are the same as those for an ordinary SRAM, and are carried out by setting the potential of the CAM word line CWL to "H" to make the transistors Q2 and Q3 conductive. At this time, the local match line 23 is usually set to "L".

Referring to FIG. 5 again, the match logic circuit 22 (including the gate circuit 22,) includes inverters 110, 111, 112, 113 and 114 for driving the respective local match lines 23-1 to 23-4 up to the charge voltage in response to the block selecting signal BSi, switching transistors Q11–Q14 formed of n-channel MOS transistors for discharging a node Nd in response to the signal potentials on the SRAM word lines SWL1-SW4, a switching transistor PT10 formed, for example, of a p-channel MOS transistor for precharging the node Nd to "H" corresponding to the level of a power source potential Vdd in response to the block selecting signal BSi received at its gate, and a transmission gate TM for selectively transmitting the potential of node Nd to the main match lines 26. The group of transistors Q11–Q14 performs NOR logic operation to discharge the potential of node Nd to "L" level with a rise in one of the SRAM word lines SSL1-SWL4.

The node Nd in "L" level shows a cache hit, and in "H" level a cache miss. The main match line 26 that receives the potential of node Nd is provided for each cache element 16. The signal H/M indicating a cache hit/miss for the SRAM cache may therefore be obtained by AND operation of signal potentials of all the main match lines. The AND operation of signal potentials of these main match lines 26 may be effected by wired AND connection of the main match lines 26 since the transmission gates TM in non-selected blocks are in OFF state.

The gate circuit 22, shown in FIG. 4A is formed of the transistors Q1–Q14, PT10 and transmission gate TM in the match logic circuit 22.

The gate circuit 27 includes switching transistors Q21, Q22, Q23 and Q24 formed, for example, of n-channel MOS transistors responsive to the block selecting signal BSi for transmitting the CAM word line drive signals CWL1-CWL4 to the corresponding CAM word lines. The CAM word line drive signals CWL1-CWL4 are generated by the CWL generator 395 only on a cache miss. Consequently, on a cache miss, the signals CWL1-CWL4 are transmitted only to the CAM cell array 21 of a selected block, whereby data are read from the CAM cell array 21.

The SRAM word driver 29 includes switching transistors Q31, Q32, Q33 and Q34 formed, for example, of n-channel MOS transistors responsive to the signal potentials on the local match lines 23-1 to 23-4 for transmitting the SRAM word line drive signals SWL1-SWL4 to the corresponding SRAM word lines. This SRAM word driver 29 drives an SRAM word line corresponding to the group in which a match is found in the CAM matrix 20.

In the above construction, one unit interface driver 17-k (k=1 to 32) is provided corresponding to 4-bit SRAM cells. Further, four DRAM sense amplifiers are provided for one unit interface driver 17-k. Thus, the DRAM cells DMC connected to one DRAM word line WL and SRAM cells SMC in the SRAM cache are in a one-to-one relationship, by the arrangement of SRAM cells divided into four groups.

The CAM matrix 21 is also divided into four groups corresponding to the four groups in the SRAM cell array (i.e. the SRAM cache). The arrangement in which the DRAM cells and SRAM cells are in a one-to-one relationship with respect to the direction of one row (word line) in the DRAM cell array is called "direct map cache mode".

Figure 9:
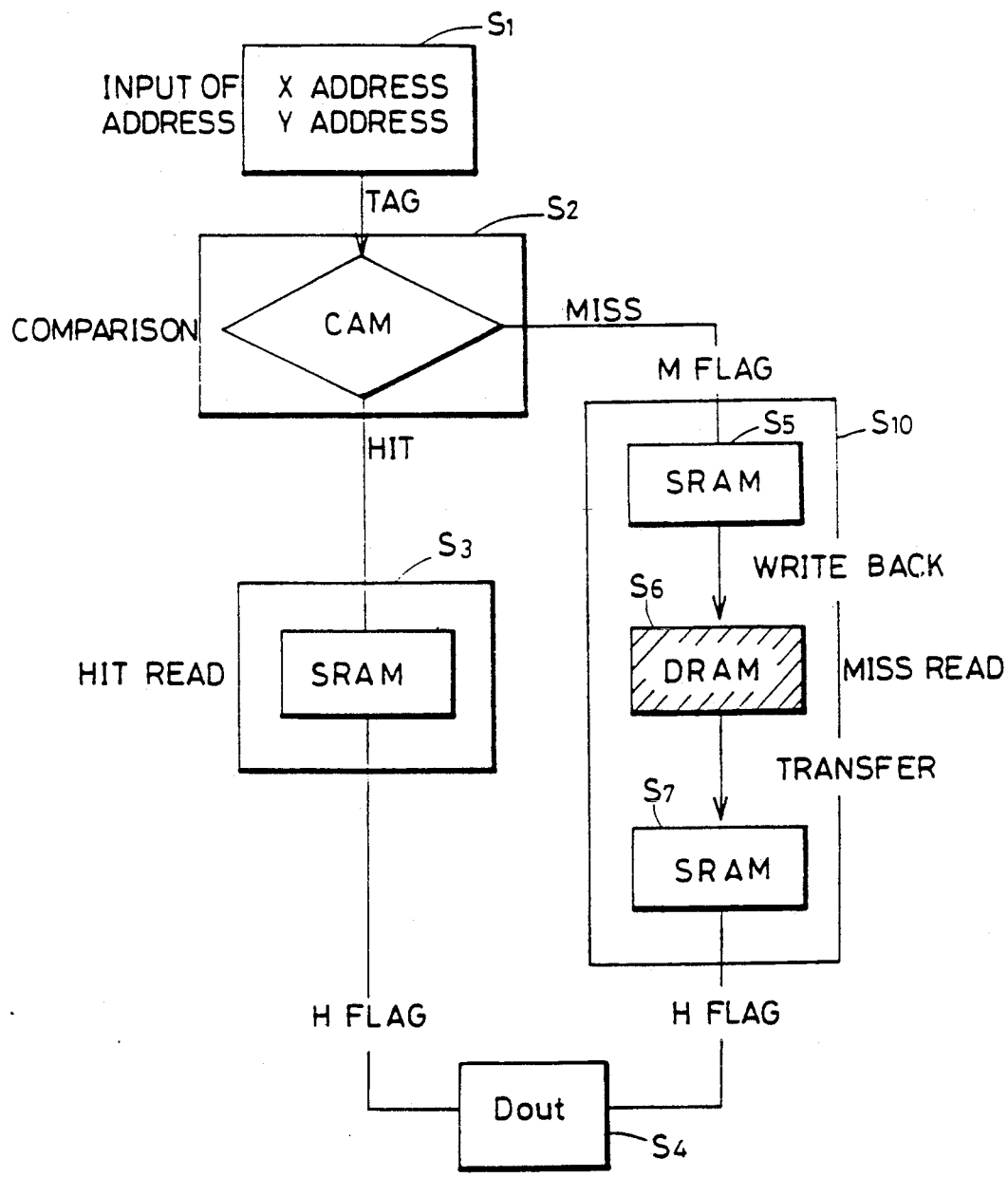
FIG. 9 is a flowchart showing a data reading operation of the semiconductor memory device containing cache according to this invention.

FIG. 9 is a flowchart showing a data reading operation of the semiconductor memory device containing cache according to this invention. The data reading operation of the semiconductor memory device according to this invention will be described hereinafter with reference to FIGS. 3 through 9.

(i) Hit read

First, the X- and Y-addresses X0-X11 and Y0-Y11 are externally applied to the X-address buffer 340 and Y-address buffer 370 at substantially the same timing, respectively. The external X-address X0-X11 are applied from the X-address buffer 340 to the CAM cell array 320 as complementary internal X-address X, $\bar{X}$ ($X$ here represents addresses X0-X11 collectively).

On the other hand, internal Y-address Y, $\bar{Y}$ ($Y$ representing Y0-Y11 collectively) generated from the Y-address buffer 370 in response to the external Y-address Y0-Y11 are applied to the BS generator 390 and Y-decoder 380 (step S1 in FIG. 9).

Next, a match detecting operation is carried out as array 320 (step S2 in FIG. 9). When address information stored in the respective cache elements in the CAM matrix equals the addresses X, $\bar{X}$ applied from the X-address buffer, the local match line of the corresponding group rises to "H". Match/mismatch with the input address is detected for each group in the CAM matrix.

The block selecting signal BS from the BS generator 390 for designating a block (i-th block) is generated for starting the detecting operation in the CAM cell array 320. When this block selecting signal BSi is applied to the match logic circuit 22, the signal potentials of the local match lines 23-1 to 23-4 of the CAM matrix 21 rise to "H" through the inverters 110–114. If, in this state, data stored in any CAM cell group of the CAM matrix 21 match with the internal address X, $\bar{X}$ currently applied, the local match line corresponding thereto is maintained in "H" level without being discharged, with the potentials of the local match lines of the remaining unmatched CAM cell groups being discharged to "L" level.

There are operations in progress parallel to the match detecting operation in the CAM cell array (CAM matrix). These are decoding of the internal Y-address by the Y-decoder 380, and an operation based on results of this decoding for selecting a bit line pair group in the DRAM cell array or an SRAM word line, that is, an operation for selecting and raising one of the SRAM word lines SWL1–SWL4 to "H".

The match detecting operation will specifically be described with reference to FIG. 5. The internal X-address X0, $\overline{X0}$–X11, $\overline{X11}$ is applied to the CAM matrix 21 including 12 bit word ×4 groups. Assume that the data stored in a CAM cell column in the first group match the X-address X0, $\overline{X0}$–X11, $\overline{X11}$ currently applied, and the data stored in the CAM cell columns in the second, third and fourth group do not match the input X-address. In this case, the second, third and fourth local match lines 23-2 to 23-4 have discharge paths formed through the CAM cells connected thereto (see the transistor Q1 in FIG. 8). Consequently, the potential levels of these local match lines 23-2 to 23-4 do not rise even if a block i to which this cache element 16 corresponds is selected and the block selecting signal BSi rises to "H".

The first local match line 23-1 does not have a discharge path formed (with the transistor Q1 in FIG. 8 being in non-conductive state). Consequently, its potential level rises to "H" level in response to the rise to "H" of the block selecting signal BSi.

Subsequently, when the SRAM word line drive signal SWL1 generated from the Y-decoder 380 in parallel with the match detecting operation in the CAM matrix 21 rises to "H", the SRAM word line drive signal SWL1 is transmitted through the transistor Q31 in the SRAM word driver 29 to the SRAM cell column corresponding to the first group in the SRAM cache, whereby only the SRAM word line SWL1 rises to "H".

When the SRAM word line SWL1 rises to "H" level, the data stored in the SRAM cells in the first group are read onto the respective SRAM bit lines 40. Of the data read onto the SRAM bit lines 40, the data of the cell selected by the column selecting signal Yi generated from the Y-decoder 380 is transmitted to the I/O line 19 through the I/O gates Tr1 and Tr2 (step S3 in FIG. 9).

In parallel with the memory cell data reading and selecting operation in the SRAM cache, the transistor Q1 in the match logic circuit 22 becomes conductive by the signal potential on the selected SRAM word line SWL1 to discharge the node Nd to "L" level. Since the block selecting signal BSi is "H" at present, the transmission gate TM is conductive to transmit the "L" potential on the node Nd to the main match line 26.

The output buffer 25, in response to the "L" from the main match line 26, determines that the data to which access is requested is stored in the SRAM (i.e. in the hit condition), and outputs the data transmitted through the I/O bus 19 and preamplifier 224, as output data Dout (step S4 in FIG. 9).

The above is an operation carried out on a hit read. An operation carried out on a hit write is similar to the hit read operation, which will be described next.

(ii) Hit write

The same operation takes place as on the hit read until an SRAM word line SWL is selected and its potential rises to "H". At this time, data for writing is transmitted from the input/output buffer 420 to the I/O bus 19.

Subsequently, when the Y-decoder 380 selects the column selecting signal Yi and its level rises to "H", the data for writing transmitted to the I/O bus 19 is written to a selected SRAM cell (the SRAM cell 321 in FIG. 5).

It is unnecessary on the hit write to carry out a write-through for writing the same data to the corresponding DRAM cell. This is because a write-back is automatically effected as described later.

An operation carried out on a miss read will be described next with reference to the flowchart of FIG. 9.

(iii) Miss read

As on the hit read, internal X-address X, $\bar{X}$ is applied to the CAM matrix 21. In this case, however, the data stored in the CAM cell matrix and the internal X-address X, $\bar{X}$ do not equal to each other. Thus, the potential levels of the first to fourth local match lines 23-1 to 23-4 all remain "L" level. The transistors Q31-Q34 in the SRAM word driver 29 also remain non-conductive.

Consequently, the potentials of the SRAM word lines in the SRAM cache 18 all remain "L" even if one of the SRAM word line drive signals SWL1-SWL4 rises to "H". In this case, since the transistors Q11-Q14 in the match logic circuit 22 are all in non-conductive state, the potential of the main match line 26 remains "H" even if a block is selected by the block selecting signal BSi. A cache miss is determined from the signal potential of the main match line 26 remaining "H", and a miss flag or a cache miss signal M is generated. As a result, a miss read operation is carried out. The output buffer 25 maintains its output at the high-impedance in response to the cache miss signal (M flag).

When the cache miss is detected and the cache miss signal (M) is generated, the column selecting signal Yi is disabled temporarily. On the other hand, the CWL generator 395 is activated, whereby the CAM word line drive signal CWL1 corresponding to the currently applied address (Y-address) rises to "H". At this time, the multiplexer 350, similarly in response to the cache miss signal (M), isolates the data input lines or internal X-address input lines from the X-address buffer 340, and maintains the former in a floating state. Thus, in response to the CAM word line drive signal CWL1, the data stored in the first CAM cell group in the CAM matrix are transmitted to the data input lines (address input lines) X, $\overline{X}$. As a result, the signal potentials on the address input lines X, $\overline{X}$ equal the data stored in the CAM cells in the first group (CAM11-CAM121), and the potential level of the local match line 23-1 rises to "H". The block selecting signal BSi is applied continuously.

When the signal potential of the local match line 23-1 rises to "H", the transistor Q31 in the SRAM word driver 29 becomes conductive to transmit the SRAM word line drive signal SWL1 already in "H" level to the word line SWL1 corresponding to the SRAM cell column in the first group. Then the data in the SRAM cells (SRAM11-SRAM321) in the first group are read onto the corresponding bit line pair 40. Thus, 32-bit SRAM cell data are read out (step S5 in FIG. 9).

Next, the SRAM cell data are read onto the SRAM bit line in response to the cache miss signal (M) from the clock generator 410. Thereafter the transfer instruction signals CRE and $\overline{CRE}$ and the transfer control signals TX1 and TX2 are generated in a predetermined sequence to activate the interface driver 17 corresponding to the selected block. The signal potentials of SRAM bit lines are transferred to the latching nodes LA and LB through the transfer gates TG2a and TG2b in response to the second transfer control signal TX2, and then the signal potentials are latched at the latching nodes LA and LB by the inverter latch circuit CMVL. After completion of the latching operation, the transfer control signal TX2 may be inactivated while activating the transfer instruction signals CRE and $\overline{CRE}$.

On the other hand, the address read from the CAM matrix 21 is applied to the X-decoder 360 under control of the multiplexer 350 in parallel with drive of the SRAM word line in the SRAM cell array and generation of the transfer instruction signals. The X-decoder 360 decodes the internal X-address as row address, selects a corresponding row in the DRAM cell array 300, and raises the potential of the selected DRAM word line WL to "H". Subsequently, data are read from the memory cells connected to the selected word line WL, and the DRAM sense amplifiers 36-39 are activated to detect and amplify the DRAM memory cell data read out. Then, the sense amplifier connecting signal SAC is applied from the Y-decoder 380 to connect the sense amplifier to the sub-I/O lines 35. The sense amplifier connecting signal SAC is similar to the SRAM word line drive signal SWL (or the CAM word line drive signal CWL), the sense amplifier connecting signal SAC1 being activated to select the sense amplifier 36 corresponding to the first group from the sense amplifiers in the four groups for connection to the sub-I/O lines 35. Then, the first transfer control signal TX1 is activated to connect the sub-I/O lines 35 to the latching nodes LA and LB through the transfer gates TX1a and TX1b.

The interface driver 17 has a greater latching ability than the DRAM sense amplifiers 36. Consequently, the data corresponding to the SRAM memory cell data read onto the sub-I/O lines 35 or SRAM bit line pair 40 is written to the selected DRAM cell. This operation is carried out only for the block designated by the signal BS. Only a restore operation is carried out for the remaining DRAM array blocks. After this writing operation, the potential of the selected DRAM word line falls to reset the DRAM cell array or isolate the sense amplifiers 36-39 from the sub-I/O lines 35 and to precharge the DRAM bit line pairs (step S6 in FIG. 9). The series of operations carried out at the cache miss for reading the corresponding SRAM cell data from the SRAM cache 18 and transferring the data to the memory cells in the DRAM constitute the "write-back" mode operation.

After resetting the DRAM, the multiplexer 350 again applies the X-address received from the X-address buffer 340 to the X-decoder 360. As a result, the DRAM word line WL corresponding to the currently applied external X-address is selected, and its potential level rises to "H". Thereafter, the sense amplifier 36 (DRAM bit line pair 31) is connected again to the sub-I/O lines 35 in response to activation of the sense amplifiers 36-39 and generation of the sense amplifier connecting signal SAC1. Subsequently, the 32-bit DRAM cell data transmitted to the respective sub-I/O lines 35 is amplified by the associated interface driver 17 activated again, and transmitted to the SRAM bit line pairs 40 (step S7 in FIG. 9). In this data transfer from DRAM array to SRAM array, after data transfer to sub-I/O lines 35, the first transfer control signal TX1 is activated to transfer the data on sub-I/O lines 35 to respective latching nodes LA and LB. Then, the instruction signals CRE and $\overline{CRE}$ are generated, followed by the generation of the second transfer control signal TX2. The first transfer control signal TX1 may be generated simultaneous with the activation of the sense amplifier connecting signals SAC1. When the interface driver 17 is disabled, all the signals CRE, $\overline{CRE}$, TX1 and TX2 are inactivated.

When the DRAM cell array is reset, the sub-I/O lines 35 are temporarily precharged/equalized to an intermediate potential between "H" and "L" and the interface drivers 17-1 to 17-32 also are disabled temporarily for preferably equalizing the latching node potentials by not shown equalizing means. At this time, even if the SRAM word line drive signal SWL is applied continuously, the potentials of the SRAM bit line pairs 40 may be unstable due to resetting (equalize/precharge) of the sub-I/O lines 35, and so may be the data in the selected SRAM memory cells, if the transfer gates TG1a to TG2a are not provided. However, the data transmitted to the sub-I/O lines 35 and amplified by the DRAM sense amplifier 36 are transmitted to the SRAM bit line pair 40. The DRAM sense amplifiers 36-39 normally have a sufficiently greater latching ability than the SRAM memory cells. Thus, the potentials on the SRAM bit line pairs 40 correspond to the 32-bit data transmitted from the DRAM cell array. Thereafter the interface drivers 17 are activated to further amplify the potential on the SRAM bit line pair 40 to an extent corresponding to each DRAM memory cell data positively. The 32-bit data is simultaneously written to the respective SRAM memory cells. Therefore, even if the transfer gates TG1a to TG2a are not provided, the device would operate properly.

The SRAM word line drive signal SWL has been described as continuously maintained at high level. However, the SRAM word line drive signal SWL may temporarily be lowered to "L" when resetting the DRAM cell array, to be raised when reactivating the DRAM cell array. The column selecting signal Yi may also be maintained at high level.

The Y-decoder 380 (unit Y-decoder 20) raises the column selecting signal Yi to "H" simultaneously with the transfer of the 32-bit data from the DRAM cell array to the SRAM cell array (SRAM cache 21), that is, simultaneously with the activation of the interface drivers 17-1 to 17-32. The memory cell data designated by the external address is transferred to the I/O line 19.

By this time the signal potential on the main match line 26 has already fallen to "L" level to show the cache hit condition in response to the rise of the SRAM word line SWL1. Consequently, the output buffer 25 outputs the data received from the preamplifier 24 as output data Dout (step S4 in FIG. 9).

In parallel with the reactivation of the DRAM, the external X-address used for the second word line selection in the DRAM cell array is applied to the CAM matrix 21. Then, the CAM word line drive signal CWL1 rises to "H", and the internal X-address X0, $\overline{X0}$-X11, $\overline{X11}$ is stored in the CAM memory cell columns in the first group in the CAM matrix 21.

(iv) Miss write

An operation carried out on a miss write is similar to the operation carried out on a miss read. A cache miss is determined by no charging of the main match line 26, and the foregoing write-back operation takes place in response to the cache miss.

Subsequently, the DRAM cell array is reset, then a DRAM word line is selected on the basis of the external X-address currently applied as at the time of miss read, the potential of the DRAM word line WL rises to "H", and the DRAM memory cells corresponding to the external address X currently applied are connected to the sub-I/O lines 35 and SRAM bit line pairs through the interface drivers 17. Then the column selecting signal Yi having been temporarily disabled rises to "H", and the data corresponding to data Din for writing transferred to the internal I/O line 19 is written to selected DRAM memory cell through the SRAM bit line pair 40, the interface driver 17 and sub-I/O lines 35. When the data is transferred from the SRAM cache 18 to DRAM cell array 300, the interface driver 17 corresponding to the selected block is activated as on the miss read. The data amplified by this interface driver 17 is also written to the corresponding memory cell in the SRAM cache.

In parallel with the data writing to the SRAM memory cell and DRAM memory cell, the new internal X-address currently applied is written to the CAM memory cell columns in the first group in the CAM matrix 21.

Figure 10:
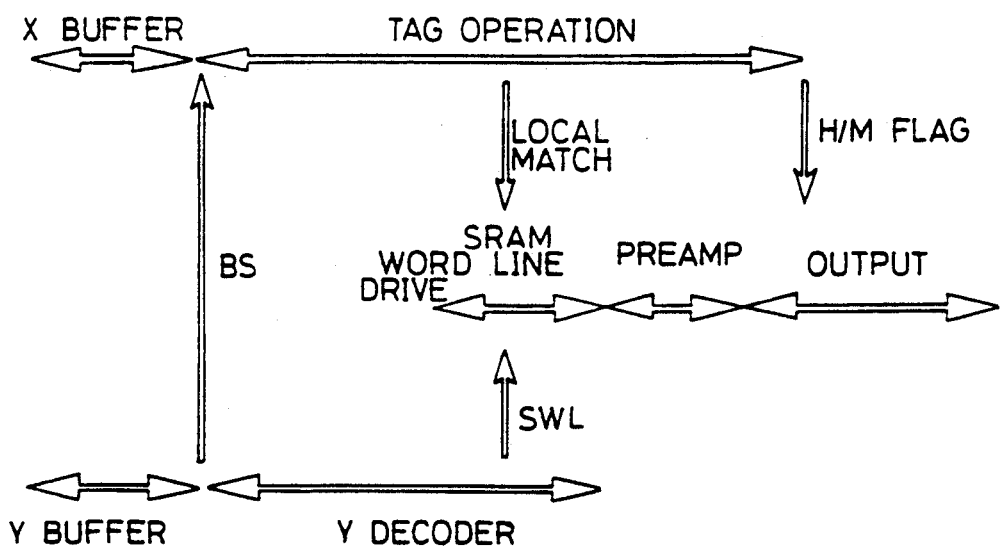
FIG. 10 shows a relationship in time between a decoding operation and a tag match/mismatch detecting operation of a Y-decoder in the semiconductor memory device containing cache according to this invention.
Figure 10:
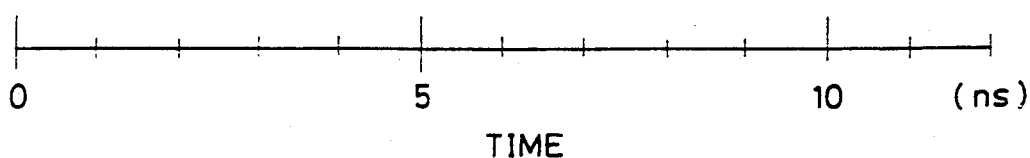

FIG. 10 is a chart showing progress of the operations of the semiconductor memory device containing cache on a cache hit. To summarize the foregoing operations, as shown in FIG. 10, the X-address and Y-address are applied to the X-buffer and Y-buffer respectively, and then internal X-address and internal Y-address are generated substantially simultaneously. The BS generator generates the block selecting signal BS in response to the internal Y-address, to cause a tag operation or cache hit/miss determination to be effected by the CAM matrix.

In parallel with the tag operation, the Y-decoder performs the column selecting operation. The Y-decoder generates the SRAM word line drive signal SWL to drive the SRAM word line at substantially the same timing as establishment of a signal potential on the local match lines (about 6 ns in FIG. 10). Next, one column in the SRAM array is selected as a result of Y-decoding, and memory cell data in the selected column are read from the SRAM array to the I/O bus and transmitted to the output buffer after being amplified by the preamplifier. After the data are transmitted to the output buffer, a signal potential is established on the main match line as a result of the tag operation, and an H/M flag indicating a cache hit/miss is output. In the event of a cache hit, the output buffer outputs the data received from the preamplifier. Consequently, the data may be read out in less than 10 ns on a hit read. That is, as shown in FIG. 10, data reading is carried out at high speed by performing the match detecting operation in the CAM matrix and the Y-decoding operation in parallel. The operation carried out on a hit write is approximately the same as the operation carried out on a hit read, with input data in place of the output data, and data writing is effected at substantially the same high speed.

Figure 11:
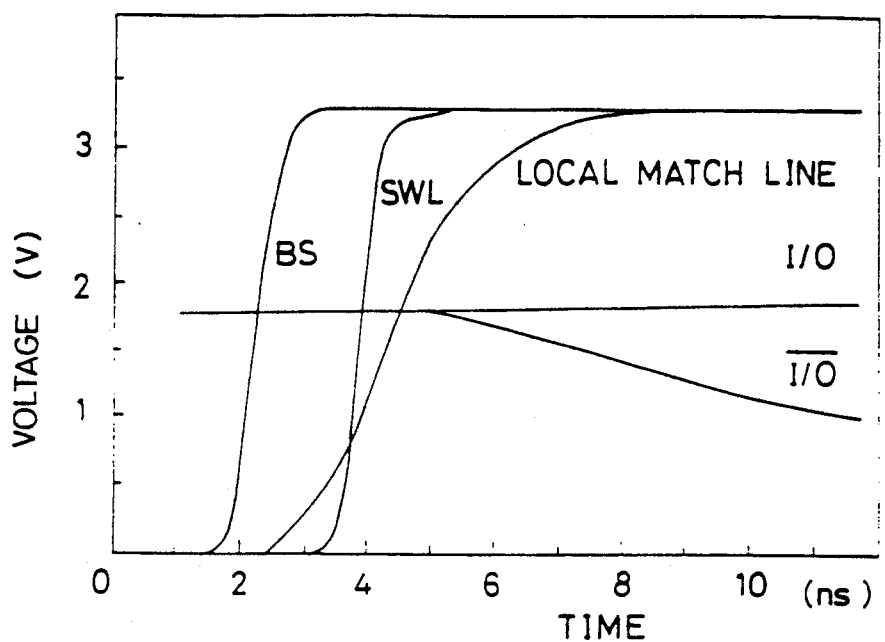
FIG. 11 is a diagram showing waveforms of signals, through simulation, occurring on a hit read in the semiconductor memory device containing cache according to this invention.

FIG. 11 shows signal waveforms occurring on a hit read as obtained by simulation. As shown in FIG. 11, the block selecting signal BS rises about 2 ns after application of the external addresses X and Y, and the SRAM word line drive signal SWL rises about 3.5 ns thereafter. The decoding operation for generating the SRAM word line drive signal SWL and the match detecting operation by the CAM matrix progress in parallel, so that the signal potential of the local match lines begins to rise at substantially the same timing as the rise of the SRAM word line drive signal SWL. By the time, the local match line having detected a match rises completely to "H", the column selecting signal Yi has already been generated by the Y-decoder, whereby transfer of the corresponding memory data from the SRAM cell array to the I/O bus is observed. Though not clearly shown in the drawing, the signal indicating a cache hit has been established by the time the local match line rises completely to "H" level to enable the output buffer to read the data at high speed.

In FIG. 11, the "H" voltage level of the signals is shown as set to about 3.3V. This is because, in a DRAM having a large capacity such as 16M bits, the operating source voltage or internal source voltage, generally, is set to about 3.3V.

Figure 12:
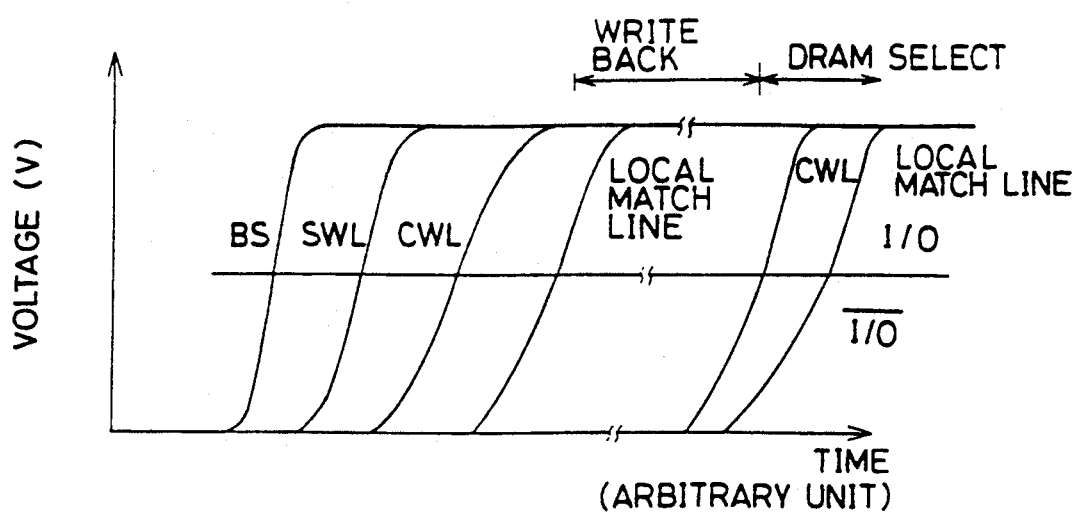
FIG. 12 is a diagram showing waveforms of signals occurring on a miss read in the semiconductor memory device containing cache according to this invention.

FIG. 12 shows signal waveforms occurring on a miss read. The unit of time is arbitrary in this case, and establishment of the potential of the I/O lines is expected to take place at about the same time as in an ordinary DRAM cell array.

On a miss read, the block selecting signal BS and SRAM word line drive signal SWL are generated at the same timing as on a hit read. The potential of the local match lines is "L" at this time, and the CAM word line drive signal CWL is generated instead, to read address from the CAM matrix and to select and drive a word line in the DRAM cell array in accordance with the read out address. After detecting and amplifying the selected DRAM memory cell data, SRAM cell data in the SRAM cell group selected by output of the local match lines are written to DRAM cells as a part of a series of operations. Next, the DRAM is accessed in accordance with the external address. In parallel with the access to the DRAM cells, the CAM word line drive signal CWL is generated again (this may be generated continuously) to write new internal address to the corresponding CAM cells in the CAM matrix. Since the local match lines rise to "H" at this time, the selected memory cell data is written from the DRAM cell array to a selected part of the SRAM cell array.

A comparison between FIG. 11 and FIG. 12 shows that data reading is effected much faster on a hit read than on a miss read. The operating timings for hit read and miss read are similar to those for hit write and miss write.

As shown in FIG. 11, it is possible to raise the SRAM word lines to "H" at high speed after detection of a match between the external address and stored addresses since the local match lines in the CAM cell matrix directly drive the SRAM word line driver.

Where the CAM cell data are read for use as an address signal for DRAM word line selection, it is necessary to nullify the internal X-address temporarily for the CAM matrix. In this case, the construction shown in FIG. 3 may be modified such that the two internal X-address signal buses provided for the CAM cell array 320 are reduced to the single signal bus extending from the multiplexer 350. Then, in response to the cache miss signal (M), the multiplexer 350 temporarily places the internal X-address signal bus in an electrically floating state (i.e. isolates the internal X-address signal bus from the X-address buffer), and after lapse of a predetermined time the internal X-address signal bus is connected, in place of the X-buffer output, to the X-decoder 360. In addition, after completion of the data transfer from the SRAM cell array to the DRAM cell array, the internal X-addresses may be transferred from the X-address buffer 340 to the CAM cell array 320 through the X-decoder 360 and internal X-address signal bus in response to resetting of the DRAM array.

This construction may be obtained by using an ordinary selector gate. Multiplexer switching control signals used in this case may be the cache miss signal and a signal for controlling operation of the DRAM, particularly a memory cycle starting signal. The signal for detecting completion of DRAM resetting may be formed by using the address transition detecting signal, which is generated from the clock generator shown in FIG. 3.

Alternatively, a multiplexer responsive to the cache miss signal may be provided on the data input lines leading to the CAM matrix, with the duplicated internal X-address buses selectively used as shown in FIG. 3.

While, in the foregoing embodiment, a write-back operation may be carried on a cache miss, a write-through operation is also possible. In this case, on a hit write, the DRAM word line WL may be selected in accordance with the X-address in parallel with data writing to the SRAM cell. After the DRAM sense amplifiers detect and amplify the data in the memory cells connected to this selected word line, the interface driver 17 is activated to transfer the data from the SRAM cell to selected DRAM cell through the SRAM bit line pair and sub-I/O lines. This added sequence of data transfer to the DRAM can be executed at high speed by carrying out the data writing to the SRAM cells and selection of a DRAM word line in parallel.

In the foregoing embodiment, data are written to both the DRAM cell array and SRAM cell array on a miss write. However, data may be written only to the DRAM cell array.

The cache DRAM semiconductor chip containing tag memory may be summarized with regard to the external specification as follows:

(1) As distinct from an ordinary address multiplexing DRAM, an external address input scheme employs a non-multiplex mode for inputting the X-address and Y-address simultaneously. The pin arrangement, therefore, is similar to that of a pseudo-static RAM or a RAM that does not involve address multiplexing.

(2) The signal potential of the main match line can be led outside. This allows the flag for determining a cache hit/miss to be monitored externally to detect a valid/invalid status of output data.

(3) On a cache hit, the cycle time and access time are made equal to each other since data are read from the SRAM. On a hit, a bit line precharge as practiced in an ordinary DRAM is unnecessary, thereby shortening the cycle time.

Figure 13:
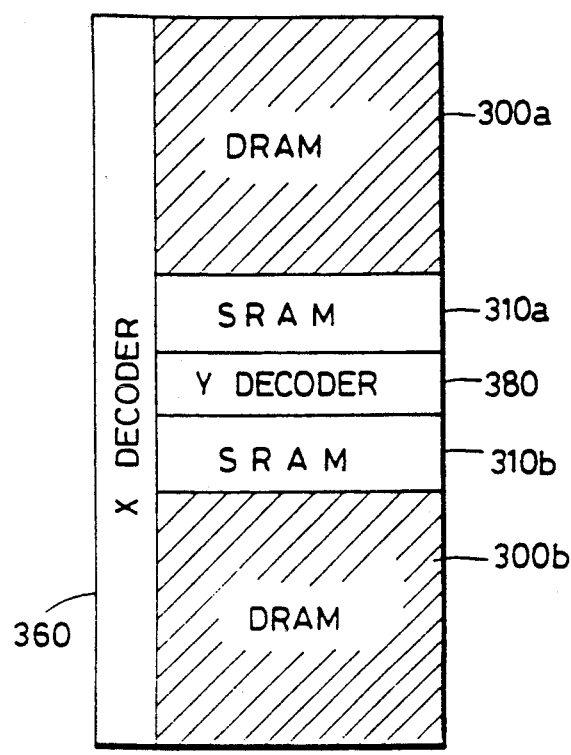
FIG. 13 is a diagram schematically showing an architecture of a semiconductor memory device containing cache according to another embodiment of this invention.

The foregoing embodiment has been described as including one DRAM cell array. The same advantages as provided by the foregoing embodiment can be obtained by dividing the DRAM into two large blocks as shown in FIG. 13. The construction shown in FIG. 13 usually is called "distributed cache architecture", in which the DRAM cell array is divided into two large array blocks 300a and 300b, with SRAM cell arrays 310a and 310b arranged therefor, respectively, and a Y-decoder shared by the SRAM cell arrays and DRAM cell array blocks.

Figure 14:
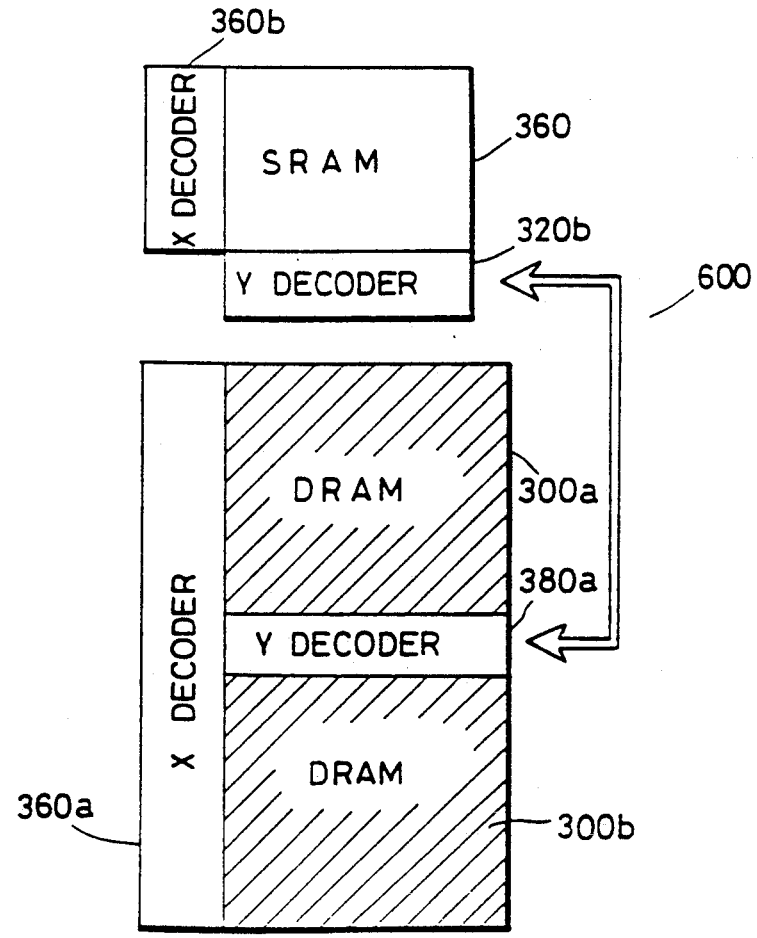
FIG. 14 is a diagram schematically showing a memory architecture of a semiconductor memory device containing cache according to a further embodiment of this invention.

Further, as shown in FIG. 14, a "localized cache architecture" may be employed in which an SRAM cell array 310 is provided separately from DRAM cell arrays 300a and 300b. In the "localized cache architecture", the DRAM cell arrays 300a and 300b are provided separately. Data transfer between the SRAM cell array 310 and DRAM cell arrays 300a and 300b is conducted through an internal bus line 600. Where the "localized cache architecture" is employed in this invention, an X-decoder 360b for the SRAM is replaced by the CAM cell array.

According to this invention, as described above, the DRAM as main memory, the SRAM as cache memory and the tag for determining a cache hit/miss are integrated on a single semiconductor chip. This construction realizes a large-capacity, address non-multiplex cache RAM which occupies substantially the same chip area as a pseudo-SRAM or an address non-multiplex DRAM, and which operates at about the same high speed as an SRAM with regard to access time and cycle time.

Further, since the tag is formed by using a CAM cell array, the circuit portion for storing and comparing addresses and detecting a match/mismatch thereof may be formed simple and compact.

The match detection signal from the tag is used as a trigger signal for directly driving the SRAM word lines. This feature allows SRAM cell data to be written and read at high speed with a simple construction.

Moreover, the path for generating the match detection signal comprises a hierarchical structure with the path for generating the first match detection signal acting as an SRAM word line drive trigger signal and the path for generating the signal indicating a cache hit/miss in response to word line potential of the SRAM array. This feature is effective to simplify chip layout and arrange the circuits efficiently, thereby to realize a tag occupying a reduced area.

Since the decoding operation of the Y-decoder and the match/mismatch detecting operation of the tag are carried out in parallel, data writing/reading to and from the SRAM cells may be effected at high speed after detection of a match. This realizes a significant reduction in access time.

Furthermore, on a miss read, data in the SRAM cells are transferred to corresponding cells in the DRAM and thereafter data are read from a DRAM cell in accordance with external address. This realizes the "write-back" mode easily without necessitating a circuit for performing complicated timing controls and a buffer memory for the write-back.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device integrated on a semiconductor chip (500), comprising;
    a DRAM cell array (300) including a plurality of dynamic type memory cells arranged in a matrix of rows and columns, said DRAM cell array including a plurality of blocks (300') each having a group of columns,
    an SRAM cell array (310) including a plurality of static type memory cells (SMC) arranged in a matrix of rows and columns, said SRAM cell array including a plurality of blocks (18) corresponding to said blocks of said DRAM cell array,
    transfer means (330; 17) for transferring data in a block between said DRAM cell array and said SRAM cell array,
    store/detect means (320; 340) for storing addresses of data stored in said blocks of said SRAM cell array, and detecting match/mismatch between an externally supplied first address signal and an address stored therein (320; 340),
    first means (20, 22, 23, 27, 29, 370, 380, 390) responsive to a match detection signal from said store/detect means and an externally supplied second address signal for selecting a corresponding memory cell from said SRAM cell array and connecting said corresponding memory cell to an internal data transmission line (I/O, I/O), and
    second means (350, 360, 380, 20) responsive to a mismatch detection signal from said store/detect means and said first and second addresses for selecting a corresponding memory cell from said DRAM cell array and connecting that memory cell to said internal data transmission line through a column of said SRAM array.

2. A memory device according to claim 1, wherein said first means includes;
    means (380) responsive to said second address signal for generating an SRAM word line drive signal (SWL1-SWL4) for selecting a row in said SRAM cell array, and
    means (29) responsive to said match detection signal from said store/detect means for directly transmitting said SRAM word line drive signal to an SRAM word line connecting memory cells of one row of the SRAM cell array for which a match is detected.

3. A memory device according to claim 1, wherein said first means includes;
    means (340) responsive to said first address signal for generating an internal row designating signal for designating a row in said DRAM cell array, and applying at least a part of said internal row designating signal to said store/detect means as an address for retrieval,
    means (370) responsive to said second address signal for generating internal column designating signal for designating a column in said DRAM cell array, said first address signal and said second address signal being externally applied at substantially the same timing,
    column/block selecting means (380, 390) responsive to said internal column designating signal for generating signals for selecting a column and a block in said DRAM cell array, respectively, and
    means (410) for causing said store/detect means and said column/block selecting means to operate parallel to each other.

4. A memory device according to claim 1 wherein said store/detect means includes;
    a plurality of match detection lines (23-1 to 23-4) extending in one direction,
    a plurality of data input lines (X0-X11, $\overline{X0}$-$\overline{X11}$) extending in a direction crossing said match detection lines for receiving respective bits corresponding to said first address signal,
    a plurality of content addressable memories (CAM1-1-CAM124) arranged at respective crossings between said match detection lines and said data input lines, content addressable memories on one row connected to a single match detection line storing an address for data stored in said SRAM cell array, and
    a plurality of CAM word lines (CWL1-CWL4) extending in said one direction, said content addressable memories on each respective row being connected to a corresponding CAM word line,
    said content addressable memories being arranged in rows and columns to correspond to said rows and columns in said SRAM cell array, and
    said match/mismatch detection signal being transmitted to said match detection lines for application to said first means.

5. A memory device according to claim 1, wherein said store/detect means is provided for each block in said SRAM cell array for detecting match/mismatch of address in relation to each block in said SRAM cell array.

6. A memory device according to claim 1, wherein said store/detect means includes means (22) responsive to a potential of said second address signal and a potential on a signal line connecting a row in said SRAM cell array for transmitting said mismatch detection signal to said second means.

7. A memory device according to claim 1, wherein said DRAM cell array includes n columns (31, 32, 33, 34) for each column (40) in said SRAM cell array, said SRAM cell array including SRAM cells arranged in n rows, n being an integer.

8. A memory device according to claim 7, wherein said second means includes means (380, 390, 330, 17) responsive to said mismatch detection signal for connecting one of said n rows in said DRAM cell array block to a corresponding column in said SRAM cell array block.

9. A memory device according to claim 1, wherein said second means includes;
- means (395) responsive to said externally applied second address signal for generating a first column detecting signal for selecting a column in said SRAM cell array, and
- means (410, 350, 360, 29, 17) responsive to said mismatch detection signal from said store/detect means for temporarily disregarding said external applied first address signal, and responsive to said first column selecting signal for reading from said store/detect means an address corresponding to said SRAM cell array column designated by said first column selecting signal, selecting a corresponding memory cell in said DRAM cell array in response to thus read out address, reading memory cell data in a designated column in said SRAM cell array in response to said first column selecting signal, and writing the data read from the SRAM cell to said selected corresponding, dynamic memory cell through said transfer means.

10. A semiconductor memory device comprising;
- a DRAM cell array (300) including a plurality of dynamic type memory cells (DMC) arranged in a matrix of rows and columns, said DRAM cell array being divided into a plurality of blocks (300,) each having a group of columns, said DRAM cell array including a plurality of DRAM word lines (WL) each having dynamic type memory cells on one row connected, and a plurality of DRAM bit lines (BL, $\overline{BL}$) each having dynamic type memory cells on one column connected,
- an SRAM cell array (310) including a plurality of static type memory cells (SMC) arranged in a matrix of rows and columns, said SRAM cell array being divided into a plurality of blocks (18) corresponding to said blocks of said DRAM cell array, each of said blocks of said SRAM cell array including a plurality of SRAM word lines (SWL) each having static type memory cells of one row in said blocks connected, and a plurality of SRAM bit lines (40) each having static type memory cells of one column connected,
- a CAM cell array (320) including a plurality of content addressable memories (CMC) arranged in a matrix of rows and columns, said CAM cell array having a plurality of blocks corresponding to said blocks of said SRAM cell array, each of said CAM cell array blocks having a plurality of CAM word lines (CWL) each having content addressable memory cells of one row in the blocks connected, a plurality of data input lines (X0-X11, X11) each having addressable memory cells of one column are connected, and a plurality of local match lines each having content addressable memory cells of one row in the blocks connected,
- a plurality of drive means (29) each disposed between each respective said SRAM cell array block and each respective said CAM cell array block, and each for directly driving an SRAM word line in the associated block to place the SRAM word line in a selected state in response to a signal potential on the local match line in the associated block,
- a plurality of cache hit/miss signal generating means (22) associated with respective said SRAM cell array blocks, for generating a signal indicating a cache hit/miss in response to a signal potential on the SRAM word line in each respective associated block,
- means (340) responsive to an externally applied first address signal for generating a first internal address signal for designating a row in said DRAM cell array, and applying at least a part of said first internal address signal to said CAM cell array blocks as a retrieval data,
- means (390) responsive to an externally applied second address signal for generating a block selecting signal,
- means (22) responsive to said block selecting signal for activating a corresponding CAM cell array block,
- means (380) responsive to said second address signal for generating a signal for selecting a column in said DRAM cell array and in said SRAM cell array,
- means (Tr1, Tr2, 19, 420) responsive to the cache hit indicating signal and said column selecting signal for connecting the selected column in said SRAM cell array to circuitry external to said semiconductor memory device, and
- means (350, 360, 380, 395, 420) responsive to the cache miss indicating signal, said column selecting signal and said first address signal for connecting a memory cell in the selected row and column in said DRAM cell array to circuitry external to said semiconductor memory device through associated column in said SRAM cell array.

11. A method of operating a semiconductor memory device comprising a DRAM cell array (300) including a plurality of dynamic type memory cells (DMC) arranged in a matrix of rows and columns, an SRAM cell array (310) including a plurality of static type memory cells (SMC) arranged in a matrix of rows and columns, and a CAM cell array (320) including a plurality of content addressable memories (CMC) arranged in a matrix of rows and columns, all formed on a single semiconductor chip (500), said method comprising the steps of;
- generating a first internal address signal in response to an externally applied first address signal, and applying at least a part of said first internal address signal to said CAM cell array as a retrieval data,
- directly driving a corresponding row in said SRAM cell array to place the row in a selected state in response to a signal potential on a row in said CAM cell array for which a match is found,
- generating a second internal address signal for selecting a column in said DRAM cell array and in said SRAM cell array in response to an externally applied second address signal, generating a signal indicating a cache hit/miss in response to signal potentials on the rows in said SRAM cell array, and connecting a corresponding column in said SRAM cell array to circuitry external to said semiconductor memory device in response to a generated cache hit indicating signal and said second internal address signal.

12. A method according to claim 11, wherein the step of generating said second internal address signal is carried out in parallel with the retrieval operation in said CAM cell array.

13. A method according to claim 11, further including the steps of selecting a row and a column in said DRAM cell array, selecting a column in said SRAM cell array, and connecting a memory cell at a crossing between the selected row and column in said DRAM cell array to circuitry external to said semiconductor memory device through the selected column in said SRAM cell array in response to said first and second internal address signals and said cache hit/miss indicating signal.

14. A method according to claim 11 further comprising the steps of;

generating a third internal address signal for selecting a row in said SRAM cell array in response to said second address signal, generating a signal for selecting a row in said CAM cell array in response to said cache hit/miss indicating signal and said second address signal, reading contents of the selected row in said CAM cell array in response to said cache hit/miss indicating signal and said CAM cell array row selecting signal, selecting a row in said DRAM cell array in response to the read out content of said CAM cell array, and writing the content of the selected row in said CAM cell array to memory cells in said selected row in said DRAM cell array in response to said third internal address signal.

15. A method according to claim 11, wherein said DRAM cell array, said SRAM cell array and said CAM cell array each include a plurality of blocks, said blocks in one array being in a one-to-one relationship with said blocks in the other arrays, and wherein said method includes the steps of generating a signal for selecting a block in response to said second address signal, and executing all said mentioned steps for the block selected by said block selecting signal.

* * * * *